US012278310B2

(12) United States Patent
Lim et al.

(10) Patent No.: US 12,278,310 B2
(45) Date of Patent: Apr. 15, 2025

(54) DISPLAY DEVICE AND MANUFACTURING METHOD THEREFOR

(71) Applicant: Samsung Display Co., LTD., Yongin-si (KR)

(72) Inventors: Bek Hyun Lim, Hwaseong-si (KR); Tae Jin Kong, Hwaseong-si (KR); Myeong Hee Kim, Yongin-si (KR); Won Kyu Kim, Seoul (KR); Je Won Yoo, Bucheon-si (KR); Hee Keun Lee, Suwon-si (KR); Chang Il Tae, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 580 days.

(21) Appl. No.: 17/605,800

(22) PCT Filed: Feb. 13, 2020

(86) PCT No.: PCT/KR2020/002048
§ 371 (c)(1),
(2) Date: Oct. 22, 2021

(87) PCT Pub. No.: WO2020/218722
PCT Pub. Date: Oct. 29, 2020

(65) Prior Publication Data
US 2022/0209070 A1    Jun. 30, 2022

(30) Foreign Application Priority Data
Apr. 22, 2019    (KR) ........................ 10-2019-0046831

(51) Int. Cl.
*H01L 33/38*    (2010.01)
*H01L 27/15*    (2006.01)
*H01L 33/00*    (2010.01)

(52) U.S. Cl.
CPC .......... *H01L 33/382* (2013.01); *H01L 27/156* (2013.01); *H01L 33/005* (2013.01); *H01L 2933/0016* (2013.01)

(58) Field of Classification Search
CPC ... H01L 33/382; H01L 33/005; H01L 27/156; H01L 2933/0016; H01L 33/0062;
(Continued)

(56) References Cited

U.S. PATENT DOCUMENTS 5,102,824  A     4/1992   Neugebauer et al.
8,872,214  B2   10/2014   Negishi et al.
(Continued)

FOREIGN PATENT DOCUMENTS

EP    3 182 470       6/2017
KR    10-2012-0059064  6/2012
(Continued)

OTHER PUBLICATIONS

International Search Report, with English translation, corresponding to International Application No. PCT/KR2020/002048 dated May 27, 2020.
(Continued)

*Primary Examiner* — Jasmine J Clark
(74) *Attorney, Agent, or Firm* — KILE PARK REED & HOUTTEMAN PLLC

(57) ABSTRACT

A display device comprises a first electrode, a first insulating layer disposed on the first electrode, a second electrode disposed on the first insulating layer, at least a part of the second electrode facing the first electrode in a first direction, one or more first light-emitting elements disposed between the first electrode and the second electrode, the one or more first light-emitting elements extending in a direction, wherein the first insulating layer partially encompasses the outer surface of the one or more first light-emitting element,
(Continued)

and the extending direction of at least one of the one or more first light-emitting element is parallel to the first direction.

20 Claims, 25 Drawing Sheets

(58) Field of Classification Search
CPC .......... H01L 33/18; H01L 33/62; H01L 33/08; H01L 33/24; H01L 24/32; H01L 24/83; H01L 24/29; H01L 24/95; H01L 2224/29193; H01L 2224/32145; H01L 2224/83192; H01L 2224/8385; H01L 2224/95145; H01L 2924/12041
USPC .......................................................... 257/79
See application file for complete search history.

(56) References Cited

U.S. PATENT DOCUMENTS

| | | | |
|---|---|---|---|
| 8,987,765 B2 | 3/2015 | Bibl et al. | |
| 9,112,112 B2 | 8/2015 | Do et al. | |
| 9,196,783 B2 | 11/2015 | Lagrange et al. | |
| 9,240,397 B2 | 1/2016 | Bibl et al. | |
| 9,570,427 B2 | 2/2017 | Bibl et al. | |
| 9,865,572 B2 | 1/2018 | Wi et al. | |
| 9,876,000 B2 | 1/2018 | Bibl et al. | |
| 10,256,221 B2 | 4/2019 | Bibl et al. | |
| 10,573,629 B2 | 2/2020 | Bibl et al. | |
| 10,629,791 B2 | 4/2020 | Lim | |
| 11,004,836 B2 | 5/2021 | Bibl et al. | |
| 11,676,952 B2 | 6/2023 | Bibl et al. | |
| 2011/0089850 A1 | 4/2011 | Shibata et al. | |
| 2015/0008456 A1 | 1/2015 | Lagrange et al. | |
| 2021/0225993 A1* | 7/2021 | Im ........................... H01L 33/62 | |
| 2021/0242380 A1 | 8/2021 | Kim et al. | |

FOREIGN PATENT DOCUMENTS

| | | | | |
|---|---|---|---|---|
| KR | 10-2012-0122159 | 11/2012 | | |
| KR | 10-2015-0006798 | 1/2015 | | |
| KR | 10-1672781 | 11/2016 | | |
| KR | 10-2017-0033905 | 3/2017 | | |
| KR | 10-2017-0083191 | 7/2017 | | |
| KR | 10-2018-0007376 | 1/2018 | | |
| KR | 10-2018-0063810 | 6/2018 | | |
| KR | 10-2018-0082667 | 7/2018 | | |
| KR | 10-2019-0023758 | 3/2019 | | |
| KR | 20190023758 A * | 3/2019 | ........... G02B 5/0242 | |
| KR | 10-2019-0124359 | 11/2019 | | |

OTHER PUBLICATIONS

Written Opinion, with English translation, corresponding to International Application No. PCT/KR2020/002048, dated May 27, 2020.

Extended European search report for European Patent Application or Patent No. 20796287.9, dated Dec. 14, 2022.

* cited by examiner

DISPLAY DEVICE AND MANUFACTURING METHOD THEREFOR

CROSS-REFERENCE TO RELATED APPLICATION(S)

This application is a national entry of International Application No. PCT/KR2020/002048, filed on Feb. 13, 2020, which claims under 35 U.S.C. 119(a) and 365(b) priority to and benefits of Korean Patent Application No. 10-2019-0046831, filed on Apr. 22, 2019 in the Korean Intellectual Property Office (KIPO), the entire contents of all of which are incorporated herein by reference.

BACKGROUND

1. Technical Field

The disclosure relates to a display device and a manufacturing method therefor.

2. Discussion of Related Art

Display devices are becoming increasingly important with the development of multimedia. Accordingly, various types of display devices such as organic light emitting displays and liquid crystal displays are being used.

A display device may include a display panel such as an organic light emitting display panel or a liquid crystal display panel as a device for displaying an image of the display device. Among display devices, a light emitting display panel may include light-emitting elements such as light emitting diodes (LEDs). For example, the LEDs may be organic light emitting diodes (OLEDs) using an organic material as a fluorescent material, or may be inorganic LEDs using an inorganic material as a fluorescent material.

Inorganic LEDs using an inorganic semiconductor as a fluorescent material are durable even in a high-temperature environment and have higher blue light efficiency than OLEDs. A transfer method using dielectrophoresis (DEP) has been developed for a manufacturing process which has been pointed out as a limitation of conventional inorganic LEDs. Research continues regarding inorganic LEDs having better durability and efficiency than OLEDs.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device which may include light-emitting elements extending in one direction and aligned in a direction perpendicular to each electrode.

Aspects of the disclosure also provide a method of manufacturing a display device. The method may include a process of fixing the light-emitting elements in a direction perpendicular to electrodes.

It should be noted that aspects of the disclosure are not limited thereto and other aspects, which are not mentioned herein, will be apparent to those of ordinary skill in the art from the following description.

According to an embodiment of the disclosure, a display device may include a first electrode, a first insulating layer disposed on the first electrode, a second electrode disposed on the first insulating layer, at least a part of the second electrode facing the first electrode in a first direction, one or more first light-emitting elements disposed between the first electrode and the second electrode, the one or more first light-emitting elements extending in a direction, wherein the first insulating layer partially covers outer surfaces of the one or more first light-emitting elements, and the extending direction of at least one of the one or more first light-emitting elements may be parallel to the first direction.

First ends of the one or more first light-emitting elements partially may contact the first electrode, and second ends of the one or more first light-emitting elements may contact the second electrode.

An acute angle formed by the direction in which the one or more first light-emitting elements extend and a second direction perpendicular to the first direction may be in the range of about 80 to about 90 degrees.

Each of the one or more first light-emitting elements may comprise a first conductivity type semiconductor, a second conductivity type semiconductor and an active layer disposed between the first conductivity type semiconductor and the second conductivity type semiconductor, and the first conductivity type semiconductor, the active layer, and the second conductivity type semiconductor may be sequentially disposed along the first direction in at least one of the first light-emitting elements.

Each of the one or more first light-emitting elements may comprise an insulating film surrounding side surfaces of the first conductivity type semiconductor, the second conductivity type semiconductor, and the active layer, and the insulating film may at least partially contact the first insulating layer.

Light emitted from the active layer in at least one of the one or more first light-emitting elements may travel parallel to the first direction.

The display device may further comprise a second insulating layer disposed between the second electrode and the first insulating layer, and an opening area disposed in an area surrounded by the second insulating layer to partially expose the first insulating layer.

The first electrode may overlap the opening area and at least a part of the second insulating layer in the first direction, and the one or more first light-emitting elements may be disposed between the first electrode and the second electrode in the opening area.

An area of the first electrode may be larger than that of the opening area.

The second ends of the one or more first light-emitting elements may partially protrude from an upper surface of the first insulating layer, and the second electrode may surround the second ends of the one or more first light-emitting elements partially protruding from the upper surface of the first insulating layers.

A thickness of the second insulating layer may be greater than a height of the second ends of each of the one or more first light-emitting elements.

A length of each of the one or more first light-emitting elements extending in the direction may be in a range of about 3 μm to about 6 μm.

The first electrode may further comprise first electrode protrusions which protrude from an upper surface thereof to cover the first ends of the first light-emitting elements.

The display device may further comprise a third electrode spaced apart from the first electrode in a second direction perpendicular to the first direction, the third electrode facing at least a part of the second electrode in the first direction, and second light-emitting elements which may be disposed between the third electrode and the second electrode, wherein the first insulating layer may be disposed between the third electrode and the second electrode.

The second insulating layer may partially overlap the first electrode and the third electrode in the first direction, and the first electrode and the third electrode may be spaced apart from each other in an area overlapping the second insulating layer.

According to an embodiment of the disclosure, a method of manufacturing a display device may include preparing a base part which may include a first electrode, a first insulating layer covering the first electrode, and a second insulating layer partially disposed on the first insulating layer, inserting light-emitting elements extending in a direction into the first insulating layer in a first direction perpendicular to an upper surface of the first insulating layer, and forming a second electrode covering the first insulating layer and the second insulating layer.

The inserting of the light-emitting elements into the first insulating layer may comprise spraying the light-emitting elements onto the first electrode, aligning the light-emitting elements such that the direction in which the light-emitting elements extend may be parallel to the first direction by forming an electric field adjacent to the first electrode, and inserting the light-emitting elements into the first insulating layer in the first direction.

The second insulating layer may comprise an opening area which partially exposes the first insulating layer, and the light-emitting elements may be inserted into the first insulating layer in the opening area.

The forming of the second electrode may further comprise removing the light-emitting elements sprayed on the second insulating layer.

An end of each of the light-emitting elements may partially protrude from the first insulating layer, and the second electrode may be formed to cover the end of each of the light-emitting elements.

The details of other embodiments are included in the detailed description and the accompanying drawings.

In a display device according to an embodiment light-emitting elements may be aligned in a vertical direction between electrodes. A method of manufacturing a display device may include a process of inserting light-emitting elements in a direction perpendicular to electrodes, and the electrodes may face each other in a thickness direction with an insulating layer interposed therebetween. Therefore, the light-emitting elements may be aligned such that a direction in which the light-emitting elements extend may be parallel to the thickness direction. The insulating layer may fix the light-emitting elements as the light-emitting elements may be inserted into the insulating layer.

Accordingly, light emitted in the direction in which the light-emitting elements extend may be output in an upward direction of each pixel.

The effects according to the embodiments are not limited by the contents above, and more various effects are included in this disclosure.

DETAILED DESCRIPTION OF THE EMBODIMENTS

Figure 1:
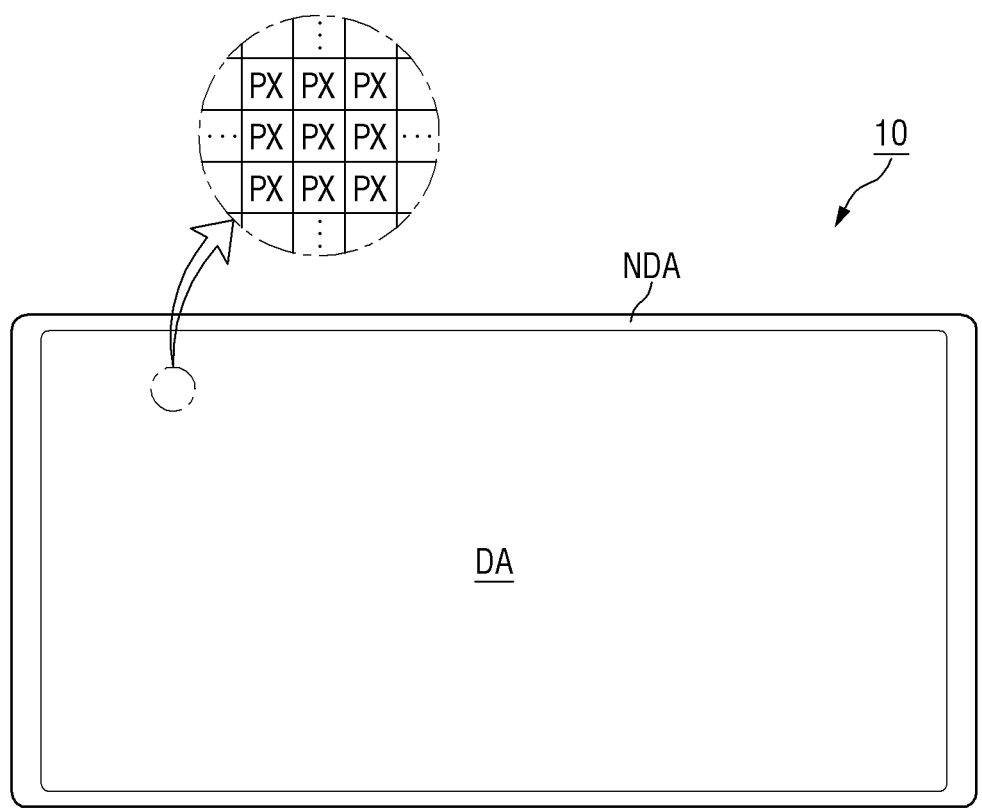
FIG. 1 is a schematic plan view of a display device according to an embodiment.
Figure 1:
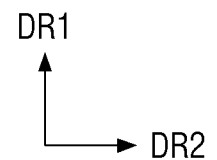

The disclosure will now be more fully made hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well (and vice versa), unless the context clearly indicates otherwise.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display device according to an embodiment.

Referring to FIG. 1, the display device 10 may display moving images or still images. The display device 10 may refer to any electronic device that provides a display screen. Examples of the display device 10 may include televisions, notebook computers, monitors, billboards, Internet of Things devices, mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 10 may include a display panel that provides a display screen. Examples of the display panel include light emitting diode display panels, organic light emitting display panels, quantum dot light emitting display panels, plasma display panels, and field emission display panels. A case where a light emitting diode display panel is applied as an example of the display panel will be described below, but the disclosure is not limited to this case, and other display panels can also be applied as long as the same technical spirit is applicable.

The shape of the display device 10 can be variously modified. For example, the display device 10 may have various shapes such as a horizontally long rectangle, a vertically long rectangle, a square, a quadrangle with rounded corners (vertices), other polygons, and a circle. The shape of a display area DA of the display device 10 may also be similar to the overall shape of the display device 10. In FIG. 1, the display device 10 and the display area DA having a horizontally long rectangular shape are illustrated.

The display device 10 may include the display area DA and a non-display area NDA. The display area DA may be an area where a screen can be displayed, and the non-display area NDA may be an area where no screen may be displayed. The display area DA may also be referred to as an active area, and the non-display area NDA may also be referred to as an inactive area.

The display area DA may generally occupy the center of the display device 10. The display area DA may include pixels PX. The pixels PX may be arranged in a matrix direction. Each of the pixels PX may be rectangular or square in plan view. However, the disclosure is not limited thereto, and each of the pixels PX may also have a rhombic planar shape having each side inclined with respect to a first direction DR1. Each of the pixels PX may include one or more light-emitting elements 300 which may emit light in a specific wavelength band to display a specific color.

Figure 2:
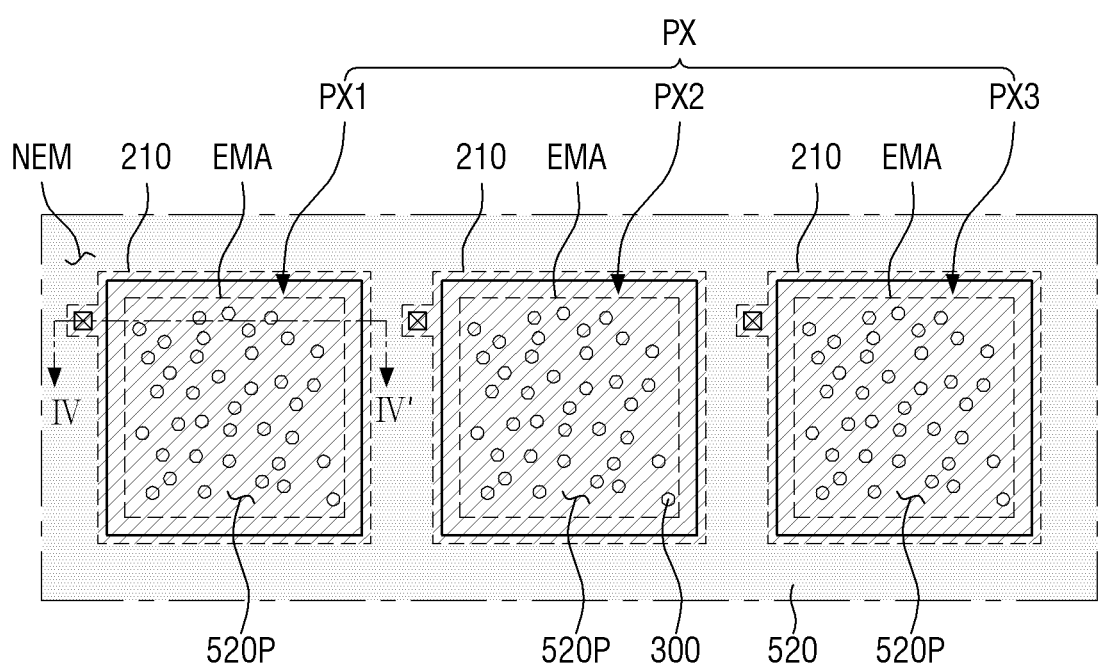
FIG. 2 is a schematic plan view of a pixel of the display device according to an embodiment.

FIG. 2 is a schematic plan view of a pixel of the display device according to an embodiment.

Referring to FIG. 2, each of the pixels PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. The first color may be red, the second color may be green, and the third color may be blue. However, the disclosure is not limited thereto, and the subpixels PXn may also emit light of a same color. Although a pixel PX includes three subpixels PXn in FIG. 2, the disclosure is not limited thereto, and the pixel PX may also include more subpixels PXn.

It will be understood that, although the terms first, second, third, etc., may be used herein to describe various elements, these elements should not be limited by these terms. These terms are only used to distinguish one element from another element. For example, elements defined as first, second, etc. are not necessarily limited to a specific structure or location and, in some cases, may be assigned other numerical terms. Thus, the number assigned to each element may be described through the drawings and the following description, and a first element discussed below could be termed a second element without departing from the teachings of the disclosure.

Each subpixel PXn of the display device 10 may include areas defined as an emission area EMA and a non-emission area NEM. The emission area EMA may be defined as an area where light-emitting elements 300 included in the display device 10 may be disposed to emit light in a specific wavelength band. Each of the light-emitting elements 300 may include an active layer 330 (see FIG. 7) as will be described later, and the active layer 330 may emit light in a specific wavelength band without directionality. For example, light emitted from the active layer 330 of each light-emitting element 300 may be radiated in a lateral direction of the light-emitting element 300 as well as toward both ends of the light-emitting element 300. The emission area EMA of each subpixel PXn may include an area in which the light-emitting elements 300 may be disposed and an area which may be adjacent to the light-emitting elements 300 and from which light emitted from the light-emitting elements 300 may be output. However, the disclosure is not limited thereto, and the emission area EMA may also include an area from which light emitted from the light-emitting elements 300 may be output after being reflected or refracted by other members. Light-emitting elements 300 may be disposed in each subpixel PXn, and an area where the light-emitting elements 300 may be disposed and an area adjacent to this area may form the emission area EMA.

The non-emission area NEM may be an area other than the emission area EMA and may be defined as an area in which the light-emitting elements 300 may not be disposed and from which no light may be output because light emitted from the light-emitting elements 300 may not reach this area.

A second insulating layer 520 may be disposed between each pixel PX or each subpixel PXn and another adjacent pixel PX or subpixel PXn. The second insulating layer 520 may include parts extending in the first direction DR1 and parts extending in a second direction DR2 and may be disposed at the boundary of each subpixel PXn to form a grid pattern. The parts of the second insulating layer 520 which extend in the first direction DR1 may separate pixels PX or subpixels PXn arranged in the second direction DR2, and the parts which extend in the second direction DR2 may separate pixels PX or subpixels PXn arranged in the first direction DR1. For example, each subpixel PX may be understood as an area surrounded by the second insulating layer 520 in the display area DA.

In the drawing, the second insulating layer 520 surrounds one pixel PX and may be disposed at the boundary of each subpixel PXn included in the pixel PX, for example, at the boundaries of the first subpixel PX1, the second subpixel PX2, and the third subpixel PX3. The second insulating layer 520 may be entirely disposed in the display area DA to surround pixels PX or subpixels PXn.

The second insulating layer 520 may be disposed on a first insulating layer 510 (see FIG. 3) to be described later, and an opening area 520P exposing a part of the first insulating layer 510 (see FIG. 3) may be disposed in an area in which the second insulating layer 520 may not be disposed. The opening area 520P may be located in an area surrounded by the parts of the second insulating layer 520 which extend in the first direction DR1 and the parts of the second insulating layer 520 which extend in the second direction DR2 to expose the first insulating layer 510 in each subpixel PXn. As illustrated in FIG. 2, the opening area 520P may be disposed in each of the first subpixel PX1, the second subpixel PX2 and the third subpixel PX3, and the light-emitting elements 300 may be disposed in the first insulating layer 510 exposed by the opening area 520P. The emission area EMA may be formed in an area in which the first insulating layer 510 may be exposed and the light-emitting elements 300 may be disposed, and the non-emission area NEM may be formed in an area in which the second insulating layer 520 may be disposed and the light-emitting elements 300 may not exist.

Each subpixel PXn formed in an area surrounded by the second insulating layer 520 may include a first electrode 210, a second electrode 220, the first insulating layer 510, and light-emitting elements 300. The light-emitting elements 300 may be disposed between the first electrode 210 and the second electrode 220 and may receive an emission signal from the first electrode 210 and the second electrode 220 to emit light in a specific wavelength band. The structure of each subpixel PXn will now be described in more detail with further reference to other drawings.

Figure 3:
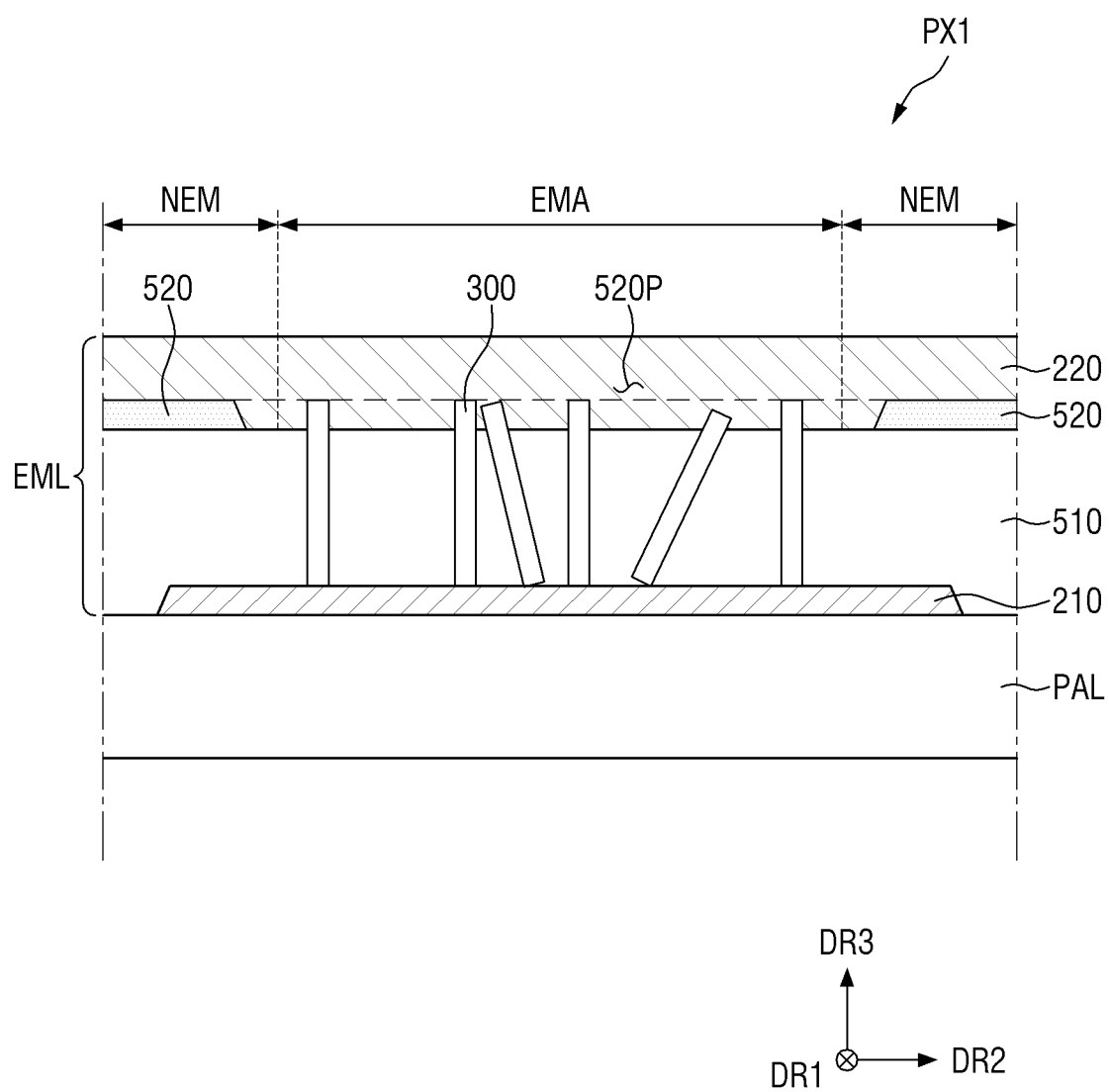
FIG. 3 is a schematic cross-sectional view of a pixel of the display device according to an embodiment.
Figure 4:
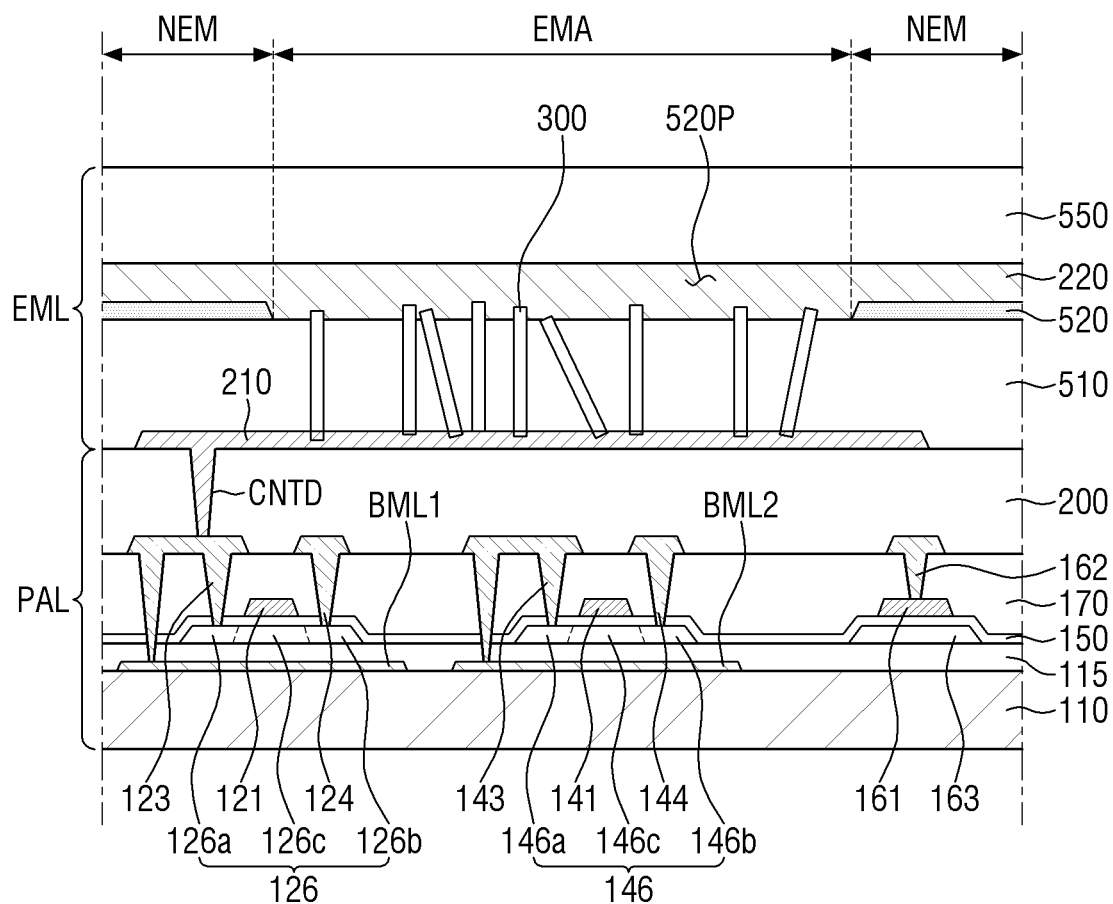
FIG. 4 is a schematic cross-sectional view taken along line IV-IV' of FIG. 2.

FIG. 3 is a schematic cross-sectional view of a pixel of the display device according to an embodiment. FIG. 4 is a schematic cross-sectional view taken along line IV-IV' of FIG. 2.

Although FIGS. 3 and 4 are cross-sectional views of the first subpixel PX1, the same illustration may be applied to other pixels PX or subpixels PXn.

Referring to FIGS. 2 through 4, the display device 10 according to an embodiment may include a circuit element layer PAL and a light emitting layer EML. The circuit element layer PAL may include a substrate 110, a buffer layer 115, a light blocking layer BML, and first and second transistors 120 and 140, and the light emitting layer EML may include electrodes 210 and 220, the light-emitting elements 300, and insulating layers 510 and 520 disposed on the first and second transistors 120 and 140.

The substrate 110 may be an insulating substrate. The substrate 110 may be made of an insulating material such as glass, quartz, polymer resin, or a combination thereof. The substrate 110 may be a rigid substrate, but may also be a flexible substrate that can be bent, folded, rolled, etc.

The light blocking layer BML may be disposed on the substrate 110. The light blocking layer BML may include a first light blocking layer BML1 and a second light blocking layer BML2. The first light blocking layer BML1 may be electrically connected to a first drain electrode 123 of the first transistor 120 which will be described later. The second light blocking layer BML2 may be electrically connected to a second drain electrode 143 of the second transistor 140.

The first light blocking layer BML1 and the second light blocking layer BML2 may be overlapped by a first active material layer 126 of the first transistor 120 and a second active material layer 146 of the second transistor 140, respectively. The first and second light blocking layers BML1 and BML2 may include a light blocking material to prevent light from entering the first and second active material layers 126 and 146. For example, the first and second light blocking layers BML1 and BML2 may be made of an opaque metal material that blocks transmission of light. However, the disclosure is not limited thereto. In some cases, the light blocking layer BML may be omitted.

The buffer layer 115 may be disposed on the light blocking layer BML and the substrate 110. The buffer layer 115 may entirely cover the substrate 110 as well as the light blocking layer BML. The buffer layer 115 may prevent diffusion of impurity ions, prevent penetration of moisture or outside air, and perform a surface planarization function. The buffer layer 115 may insulate the light blocking layer BML and the first and second active material layers 126 and 146 from each other.

A semiconductor layer may be disposed on the buffer layer 115. The semiconductor layer may include the first active material layer 126 of the first transistor 120, the second active material layer 146 of the second transistor 140, and an auxiliary layer 163. The semiconductor layer may include polycrystalline silicon, monocrystalline silicon, an oxide semiconductor, or the like, or a combination thereof.

The first active material layer 126 may include a first doped region 126a, a second doped region 126b, and a first channel region 126c. The first channel region 126c may be disposed between the first doped region 126a and the second doped region 126b. The second active material layer 146 may include a third doped region 146a, a fourth doped region 146b, and a second channel region 146c. The second channel region 146c may be disposed between the third doped region 146a and the fourth doped region 146b. The first active material layer 126 and the second active material layer 146 may include polycrystalline silicon. The polycrystalline silicon may be formed by crystalizing amorphous silicon. Examples of the crystallization method may include, but are not limited to, a rapid thermal annealing (RTA) method, a solid phase crystallization (SPC) method, an excimer laser annealing (ELA) method, a metal induced crystallization (MILC) method, and a sequential lateral solidification (SLS) method. In other embodiments, the first active material layer 126 and the second active material layer 146 may include monocrystalline silicon, low-temperature polycrystalline silicon, amorphous silicon, or the like, or a combination thereof. The first doped region 126a, the second doped region 126b, the third doped region 146a, and the fourth doped region 146b may be regions of the first active material layer 126 and the second active material layer 146 which may be doped with impurities. However, the disclosure is not limited thereto.

A first gate insulating layer 150 may be disposed on the semiconductor layer. The first gate insulating layer 150 may entirely cover the buffer layer 115 as well as the semiconductor layer. The first gate insulating layer 150 may function as a gate insulating layer of each of the first and second transistors 120 and 140.

A first conductive layer may be disposed on the first gate insulating layer 150. The first conductive layer disposed on the first gate insulating layer 150 may include a first gate electrode 121 disposed on the first active material layer 126 of the first transistor 120, a second gate electrode 141 disposed on the second active material layer 146 of the second transistor 140, and a power wiring 161 disposed on the auxiliary layer 163. The first gate electrode 121 may overlap the first channel region 126c of the first active material layer 126, and the second gate electrode 141 may overlap the second channel region 146c of the second active material layer 146. An interlayer insulating film 170 may be disposed on the first conductive layer. The interlayer insulating film 170 may function as an interlayer insulating film. The interlayer insulating film 170 may include an organic insulating material and perform a surface planarization function.

A second conductive layer may be disposed on the interlayer insulating film 170. The second conductive layer may include the first drain electrode 123 and a first source electrode 124 of the first transistor 120, the second drain electrode 143 and a second source electrode 144 of the second transistor 140, and a power electrode 162 disposed on the power wiring 161.

The first drain electrode 123 and the first source electrode 124 may respectively contact the first doped region 126a and the second doped region 126b of the first active material layer 126 through contact holes penetrating the interlayer insulating film 170 and the first gate insulating layer 150. The second drain electrode 143 and the second source electrode 144 may respectively contact the third doped region 146a and the fourth doped region 146b of the second active material layer 146 through contact holes penetrating the interlayer insulating film 170 and the first gate insulating layer 150. The first drain electrode 123 and the second drain electrode 143 may be electrically connected to the first light blocking layer BML1 and the second light blocking layer BML2 through other contact holes, respectively.

A via layer 200 may be disposed on the second conductive layer. The via layer 200 may include an organic insulating material and perform a surface planarization function.

The first electrode 210 may be disposed on the via layer 200. The first electrode 210 may be disposed in each subpixel PXn and may be spaced apart from the first electrode 210 disposed in an adjacent subpixel PXn as illustrate in FIG. 2.

The first electrode 210 may be shaped like a quadrangle in plan view by including sides extending in the first direction DR1 and sides extending in the second direction DR2. However, the shape of the first electrode 210 is not limited thereto, and the sides extending in the first direction DR1 may also be inclined with respect to the first direction DR1. The display device 10 includes first electrodes 210, and the first electrodes 210 may be disposed in the subpixels PXn, respectively, and may be spaced apart from each other. The first electrodes 210 may be disposed in an isolated or linear pattern in the entire display area DA. However, the disclosure is not limited thereto.

In an embodiment, the area of the first electrode 210 may be larger than the area of the opening area 520P. For example, widths of the first electrode 210 measured in the first direction DR1 and measured in the second direction DR2 may be greater than widths of the opening area 520P measured in the first direction DR1 and measured in the second direction DR2, respectively. Accordingly, the first electrode 210 may overlap the opening area 520P and a part of the second insulating layer 520 in a third direction DR3 which may be a thickness direction. As will be described later, the first electrode 210 may be electrically connected to the light-emitting elements 300, and the first electrode 210 may be disposed on the via layer 200 over a larger area than the emission area EMA in which the light-emitting elements 300 may be disposed. This will be described in more detail later with reference to other drawings.

The first electrode 210 may contact the first drain electrode 123 through a first electrode contact hole CNTD penetrating the via layer 200 to partially expose the first drain electrode 123 of the first transistor 120. The first electrode 210 may receive an electrical signal from the first transistor 120. A protruding part may be disposed on a side of the first electrode 210, and the first electrode 210 may be electrically connected to the first transistor 120 through the first electrode contact hole CNTD in the protruding part. However, the disclosure is not limited thereto. The first electrode 210 may also not include the protruding part and may be electrically connected to the first transistor 120 through the first electrode contact hole CNTD in any area.

The first electrode 210 may include a conductive material having high reflectivity. For example, the first electrode 210 may include a metal such as silver (Ag), copper (Cu), aluminum (Al), or a combination thereof, as a material having high reflectivity. The first electrode 210 may reflect light emitted from the light-emitting elements 300 in an upward direction of each subpixel PXn. The first electrode 210 may have a structure in which a transparent conductive material and a metal layer having high reflectivity may be each stacked on each other in one or more layers or may be formed as a single layer including the transparent conductive material and the metal layer having high reflectivity. In an embodiment, the first electrode 210 may have a stacked structure of ITO/Ag/ITO/IZO or may be an alloy containing aluminum (Al), nickel (Ni), lanthanum (La), etc., or a combination thereof. However, but the disclosure is not limited thereto.

The first insulating layer 510 may be disposed on the first electrode 210. The first insulating layer 510 may be entirely disposed in the display area DA of the display device 10 as well as on the first electrode 210. The first electrodes 210 respectively disposed in adjacent subpixels PXn may be spaced apart from each other in the second direction DR2, and the first insulating layer 510 may also be disposed on the via layer 200 exposed between the first electrodes 210 spaced apart from each other. The first insulating layer 510 may insulate the first electrode 210 and the second electrode 220 from each other while forming a flat upper surface by compensating for a step formed by the first electrode 210.

According to an embodiment, the first insulating layer 510 may be formed to at least partially cover outer surfaces of the light-emitting elements 300 disposed between the first electrode 210 and the second electrode 220. As will be described later, the light-emitting elements 300 may extend in a direction and may be disposed in a direction perpendicular to the upper surface of the first insulating layer 510. In a manufacturing process of the display device 10, the light-emitting elements 300 may be aligned in the direction perpendicular to the upper surface of the first insulating layer 510, for example, in the third direction DR3 and may be physically inserted into the first insulating layer 510.

Each of the light-emitting elements 300 may have a first end contacting the first electrode 210, a second end contacting the second electrode 220, and the outer surface partially surrounded by the first insulating layer 510. The first insulating layer 510 may prevent the light-emitting elements 300 disposed between the first electrode 210 and the second electrode 220 from contacting each other while fixing the light-emitting elements 300.

In an embodiment, the first insulating layer 510 may include an organic insulating material. The first insulating layer 510 may include a material having a relatively lower hardness than that of the light-emitting elements 300. Thus, the light-emitting elements 300 may be physically inserted into the first insulating layer 510 during the manufacturing process of the display device 10. For example, the first insulating layer 510 may include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, polymethyl methacrylate-polycarbonate synthetic resin, or a combination thereof. However, the disclosure is not limited thereto.

The second insulating layer 520 may be disposed on the first insulating layer 510. The second insulating layer 520 disposed on the first insulating layer 510 may extend in the first direction DR1 and the second direction DR2 and may be disposed at the boundary between the subpixels PXn. The opening area 520P exposing a part of the first insulating layer 510 may be disposed in an area surrounded by the second insulating layer 520. In FIGS. 3 and 4, parts of the second insulating layer 520 which extend in the first direction DR1 may be spaced apart in the second direction DR2, and the opening area 520P may be disposed therebetween. The second insulating layer 520 according to an embodiment may block an electric field formed on the first electrode 210 during the manufacturing process of the display device 10 while defining the boundary of each subpixel PXn.

As described above, since the opening area 520P surrounded by the second insulating layer 520 may have a smaller area than the first electrode 210, at least a part of the second insulating layer 520 according to the embodiment may overlap the first electrode 210 in the third direction DR3. Both sides of the first electrode 210 in the second direction DR2 may overlap the second insulating layer 520 in the third direction DR3, and sides of the second insulating layer 520 which contact the opening area 520P may be recessed inward from both sides of the first electrode 210. An electric field formed on the first electrode 210 in the manufacturing process of the display device 10 may be formed only in the opening area 520P because it may be blocked in an area overlapping the second insulating layer 520. Accordingly, the light-emitting elements 300 may be aligned on the first insulating layer 510 in the opening area 520P in which the second insulating layer 520 may not be disposed. The light-emitting elements 300 may be inserted and fixed in the first insulating layer 510 to form the emission area EMA of each subpixel PXn.

The second electrode 220 may be disposed on the first insulating layer 510 exposed by the opening area 520P and the second insulating layer 520. The second electrode 220 may be entirely disposed in the display area DA of the display device 10. For example, unlike the first electrode 210, a single second electrode 220 may be disposed in each pixel PX or each subpixel PXn without distinction therebetween.

Although not illustrated in the drawings, the second electrode 220 may contact the power wiring 161 through a contact hole penetrating the first insulating layer 510 and the via layer 200 to expose a part of the power electrode 162 in an area other than the display area DA. The second electrode 220 may receive an electrical signal from the power wiring 161.

In an embodiment, the first electrode 210 may be a pixel electrode separate for each subpixel PXn, and the second electrode 220 may be a common electrode commonly connected along each subpixel PXn. Any one of the first electrode 210 and the second electrode 220 may be anodes of the light-emitting elements 300, and the other may be cathodes of the light-emitting elements 300. However, the disclosure is not limited thereto, and the opposite may also be the case.

The second electrode 220 may contact the second ends of the light-emitting elements 300 disposed between the first electrode 210 and the second electrode 220. According to an embodiment, the second electrode 220 may be formed to cover the second ends of the light-emitting elements 300 which protrude from the upper surface of the first insulating layer 510. The light-emitting elements 300 may contact the second electrode 220 to receive an electrical signal and may emit light in a specific wavelength band in the upward direction above the second electrode 220. The second electrode 220 may include a transparent conductive material. For example, the second electrode 220 may include a material such as indium tin oxide (ITO), indium zinc oxide (IZO), indium tin zinc oxide (ITZO), or a combination thereof, but the disclosure is not limited thereto.

The light-emitting elements 300 may be disposed between the first electrode 210 and the second electrode 220. The light-emitting elements 300 may extend in a direction and may be inserted into the first insulating layer 510. The outer surfaces of the light-emitting elements 300 according to an embodiment may be partially surrounded by the first insulating layer 510. The light-emitting elements 300 may be spaced apart from each other and may be aligned substantially parallel to each other. A gap between the light-emitting elements 300 is not particularly limited. In some cases, light-emitting elements 300 may be disposed adjacent to each other to form a cluster, and other light-emitting elements 300 may be disposed at regular intervals to form a cluster or may be oriented and aligned in a direction with non-uniform density.

According to an embodiment, the first ends of the light-emitting elements 300 may partially contact the first electrode 210, and the second ends opposite the first ends may contact the second electrode 220. In the manufacturing process of the display device 10, the light-emitting elements 300 may be vertically inserted into the first insulating layer 510 disposed on the first electrode 210 so that the first ends partially contact the first electrode 210, and the second electrode 220 may be disposed on the first insulating layer 510 so that the second ends contact the second electrode 220. The light-emitting elements 300 may receive an electrical signal because their first ends and second ends may be electrically connected to the first electrode 210 and the second electrode 220.

The direction in which the light-emitting elements 300 extend may be substantially parallel to the third direction DR3 in which the first electrode 210 and the second electrode 220 face each other. The light-emitting elements 300 extending in the direction may emit light in a specific wavelength band in the direction. Since the direction in which the light-emitting elements 300 extend may be parallel to the third direction DR3 in which the first electrode 210 and the second electrode 220 face each other, the light-emitting elements 300 may emit light in a specific wavelength band in the upward direction above the second electrode 220, for example, in the upward direction of each subpixel PXn. Light emitted from the second ends of the light-emitting elements 300 which contact the second electrode 220 may pass through the second electrode 220 including a transparent material and travel in an upward direction of each subpixel PXn, and light emitted from the first ends of the light-emitting elements 300 which may contact the first electrode 210 may be reflected by the first electrode 210 including a material having high reflectivity to travel in the upward direction of each subpixel PXn.

Figure 5:
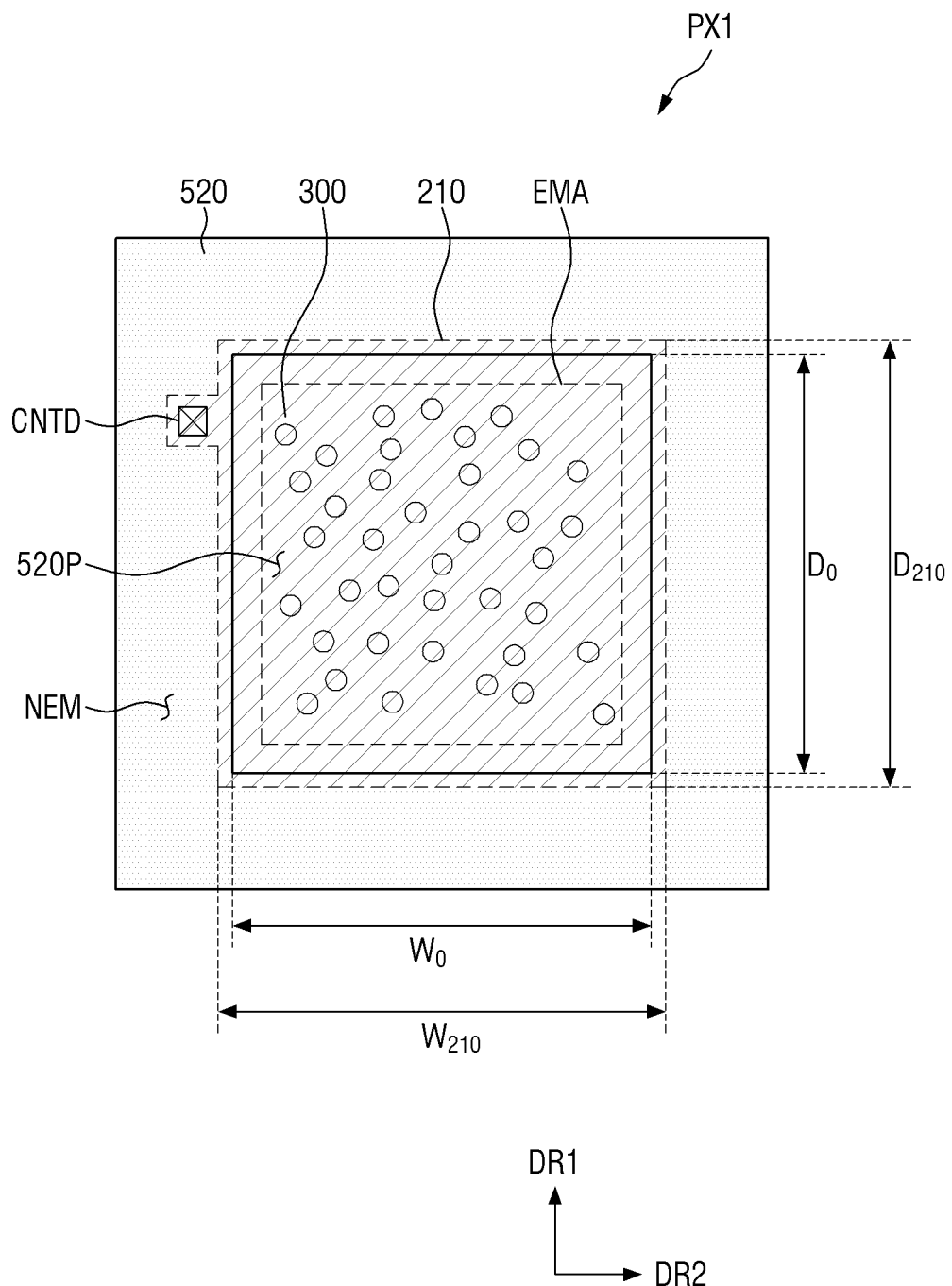
FIG. 5 is a schematic plan view of a subpixel of FIG. 2.
Figure 6:
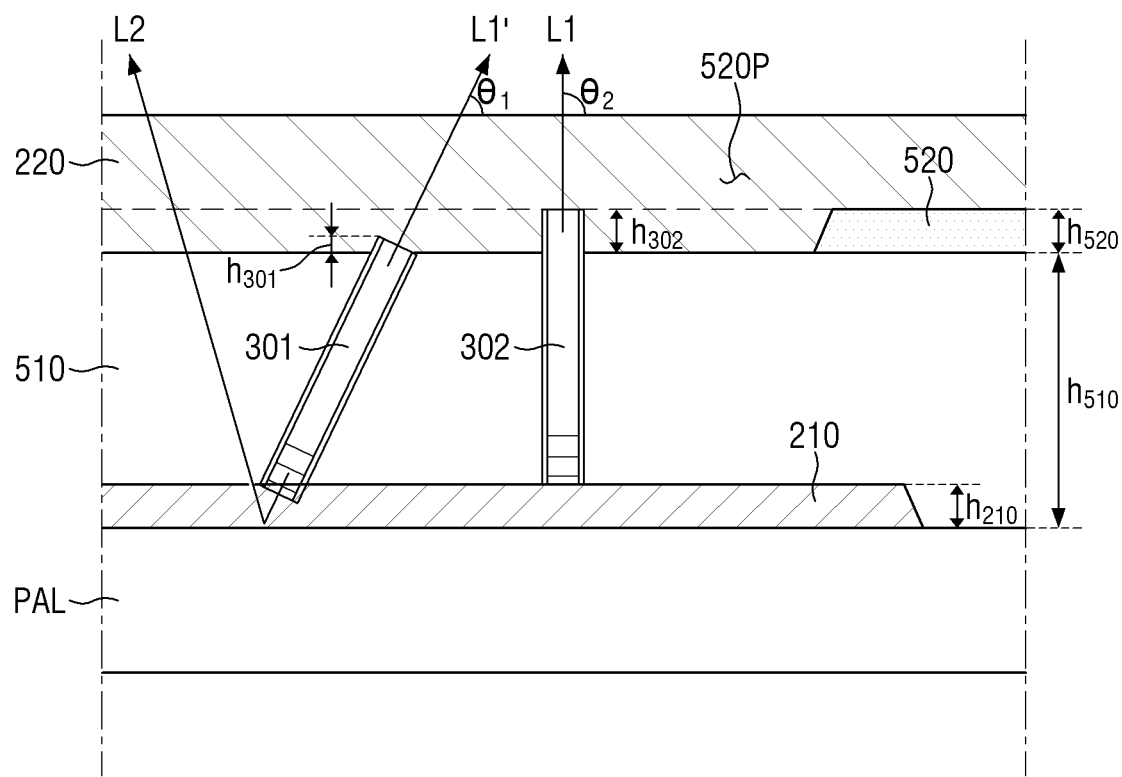
FIG. 6 is an enlarged schematic cross-sectional view of a part of FIG. 3.

FIG. 5 is a schematic plan view of a subpixel of FIG. 2. FIG. 6 is an enlarged schematic cross-sectional view of a part of FIG. 3.

Referring to FIGS. 5 and 6, each pixel PX or subpixel PXn may include the emission area EMA formed by placing the light-emitting elements 300 in the opening area 520P and the non-emission area NEM in which the light-emitting elements 300 may not be disposed but the second insulating layer 520 may be located. The first electrode 210 of the display device 10 according to the embodiment may have a larger area than the opening area 520P. As illustrated in the drawings, a first width D210 of the first electrode 210 measured in the first direction DR1 may be greater than a width Do of the opening area 520P measured in the first direction DR1, and a second width W210 of the first electrode 210 measured in the second direction DR2 may be greater than a width Wo of the opening area 520P measured in the second direction DR2. Since the opening area 520P may be located in an area surrounded by the second insulating layer 520, the first electrode 210 may have a larger area than the opening area 520P and may partially overlap the second insulating layer 520 in the third direction DR3.

As will be described later, the manufacturing process of the display device 10 may include aligning the light-emitting elements 300 by forming an electric field on the first electrode 210. The first electrode 210 may be utilized as an alignment electrode that transmits an alignment signal needed to align the light-emitting elements 300. The alignment signal transmitted to the first electrode 210 may form an electric field on the first electrode 210 in the third direction DR3, and the electric field may align the light-emitting elements 300 such that the direction in which the light-emitting elements 300 extend may be the direction perpendicular to the upper surfaces of the first electrode 210 and the first insulating layer 510, for example, the third direction DR3.

In case that the first electrode 210 has a smaller area than the opening area 520P in which the first insulating layer 510 may be exposed, some light-emitting elements 300 may be inserted into the first insulating layer 510 in a state where they may not be aligned by the electric field. These light-emitting elements 300 may not contact the first electrode 210 and the second electrode 220 and may cause an emission failure in each subpixel PXn. Since the first electrode 210 according to an embodiment may have a larger area than the opening area 520P in which the light-emitting elements 300 may be disposed, it can prevent the light-emitting elements 300 from being inserted into the first insulating layer 510 in a state where they may not be aligned in a direction in the manufacturing process of the display device 10.

The first electrode 210 may include an area overlapping the second insulating layer 520 in the third direction DR3, and the electric field formed by the alignment signal transmitted to the first electrode 210 may be blocked by the second insulating layer 520. In the aligning of the light-emitting elements 300, light-emitting elements 300 sprayed on the second insulating layer 520 may not be aligned by the electric field but may remain on the second insulating layer 520. The light-emitting elements 300 remaining on the second insulating layer 520 may be removed in case that light-emitting elements 300 aligned by the electric field may be cleaned after being inserted into the first insulating layer 510.

Accordingly, light-emitting elements 300 may be aligned on the first electrode 210 in the direction perpendicular to the first insulating layer 510 by the electric field formed in the opening area 520P in which the second insulating layer 520 may not be disposed. The light-emitting elements 300 aligned in the direction perpendicular to the first insulating layer 510 may be physically inserted into the first insulating layer 510, and the first ends thereof may contact the first electrode 210, and the second ends thereof may contact the second electrode 220.

According to an embodiment, at least some of the light-emitting elements 300 may extend in a direction parallel to the third direction DR3 in which the first electrode 210 and the second electrode 220 face each other. As illustrated in FIG. 6, light-emitting elements 300 may be disposed between the first electrode 210 and the second electrode 220 and may be partially inserted into the first insulating layer 510. In an embodiment, the light-emitting elements 300 may include first light-emitting elements 301 extending in a direction not parallel to the third direction DR3 and second light-emitting elements 302 extending in the direction parallel to the third direction DR3.

In a manufacturing process of the display device 10, the electric field formed on the first electrode 210 may align the light-emitting elements 300 such that the light-emitting elements 300 extend in the direction perpendicular to the upper surface of the first insulating layer 510. Since the direction in which the light-emitting elements 300 extend may be aligned in the direction perpendicular to the first insulating layer 510, like the second light-emitting elements 302, an acute angle θ2 formed by the direction in which the second light-emitting elements 302 extend and the surface direction (i.e., the second direction DR2) of the upper surface of the first insulating layer 510 or an upper surface of the second electrode 220 may be about 90 degrees. As will be described later, each light-emitting element 300 according to an embodiment may include an active layer 330 (see FIG. 7) to emit light in a specific wavelength band from both ends along a direction in which the light-emitting element 300 extends. In case that the light-emitting elements 300, like the second light-emitting elements 302, extend in a direction perpendicular to the second direction DR2, light emitted from the active layer 330 may be output upward above the second electrode 220 to travel in the upward direction of each subpixel PXn (L1 of FIG. 6). For example, in an embodiment, in the case of at least some of the light-emitting elements 300, for example, the second light-emitting elements 302, light L1 emitted from the active layer 330 may travel parallel to the third direction DR3.

However, at least some of the light-emitting elements 300, for example, the first light-emitting elements 301 may be aligned in a direction not perpendicular to the second direction DR2 by the electric field. In an embodiment, an acute angle θ1, θ2 formed by the direction in which the light-emitting elements 300 extend and the second direction DR2 perpendicular to the third direction DR3 in which the first electrode 210 and the second electrode 220 face each other may be in the range of about 80 to about 90 degrees. The electric field formed on the first electrode 210 may be in the third direction DR3, but some of the light-emitting elements 300, like the first light-emitting elements 301, may not extend in the third direction DR3. However, in case that the acute angle θ1 formed by the direction in which the light-emitting elements 300, like the first light-emitting elements 301, extend and the second direction DR2 may be in the range of about 80 to about 90 degrees, light L1' emitted from the second ends of the first light-emitting elements 301 which contact the second electrode 220 may be output in a direction inclined from the upper surface of the second electrode 220 and the upward direction of each subpixel PXn (L1' of FIG. 6). Light L2 emitted from the first ends of the first light-emitting elements 301 which contact the first electrode 210 may be reflected by the first electrode 210 including a material having high reflectivity in the upward direction of each subpixel PXn (L2 of FIG. 6). However, the acute angle at which the light-emitting elements 300 may be inclined is not limited to the above angle, and the light-emitting elements 300 may be inserted into the first insulating layer 510 at an angle within an allowable range.

The first ends of the light-emitting elements 300 may partially contact the first electrode 210, and the second ends opposite the first ends may contact the second electrode 220. According to an embodiment, the second ends of the light-emitting elements 300 may partially protrude from the upper surface of the first insulating layer 510, and the second electrode 220 may be formed to cover the protruding second ends of the light-emitting elements 300. The light-emitting elements 300 may be physically inserted into the first insulating layer 510, and the first ends thereof may partially contact the first electrode 210. In an embodiment, a length h (see FIG. 7) of each light-emitting element 300 measured in the extending direction of the light-emitting element 300 may be greater than a height h510 of the first insulating layer 510. Since the light-emitting elements 300 may be disposed on the first electrode 210 and have the length h greater than the height h510 of the first insulating layer 510, the second ends opposite the first ends in contact with the first electrode 210 may protrude from the upper surface of the first insulating layer 510. The second electrode 220 may be formed to cover and smoothly contact the second ends of the light-emitting elements 300 which protrude from the upper surface of the first insulating layer 510.

In an embodiment, heights h301 and h302 of the second ends of the light-emitting elements 300 which protrude above the first insulating layer 510 may be smaller than a thickness h520 of the second insulating layer 520. As described above, the light-emitting elements 300 may be aligned by the electric field formed on the first electrode 210 and may be physically inserted into the first insulating layer 510. The light-emitting elements 300 may be physically inserted by a jig device ZIG (see FIG. 14). In order to prevent the first electrode 210 or the circuit element layer PAL from being damaged, the jig unit ZIG may apply a physical force until its lower surface touches the upper surface of the second insulating layer 520. Accordingly, the light-emitting elements 300 may be inserted into the first insulating layer 510 such that the second ends lie at a position lower than at least the height of the second insulating layer 520. For example, the height h301 of the second end of each first light-emitting element 301 which protrudes above the first insulating layer 510 may be smaller than the thickness h520 of the second insulating layer 520, and the height h302 of the protruding second end of each second light-emitting element 302 may be substantially the same as the thickness h520 of the second insulating layer 520.

In an example, the sum of the length h of each light-emitting element 300 and a thickness h210 of the first electrode 210 may be equal to the sum of the height h510 of the first insulating layer 510 and the thickness h520 of the second insulating layer 520. For example, in case that the length h of each light-emitting element 300 is about 3.5 μm and the thickness h210 of the first electrode 210 is about 0.2 μm, the thickness h520 of the second insulating layer 520 may be about 0.3 μm, and the height h510 of the first insulating layer 510 may be about 3.4 μm. However, the above numerical range is merely an example, and the disclosure is not limited thereto.

Referring back to FIGS. 3 and 4, a passivation layer 550 may be disposed on the second electrode 220. The passivation layer 550 may function to protect members disposed on the via layer 200 from an external environment.

Each of the first insulating layer 510, the second insulating layer 520, and the passivation layer 550 described above may include an inorganic insulating material or an organic insulating material. In an embodiment, the first insulating layer 510, the second insulating layer 520, and the passivation layer 550 may include an inorganic insulating material such as silicon oxide (SiOx), silicon nitride (SiNx), silicon oxynitride (SiOxNy), aluminum oxide (Al2O3), aluminum nitride (AlN), or a combination thereof. In other embodiments, the first insulating layer 510, the second insulating layer 520, and the passivation layer 550 may include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, polymethyl methacrylate-polycarbonate synthetic resin, or a combination thereof. However, the disclosure is not limited thereto.

Each of the light-emitting elements 300 may be a light emitting diode. Specifically, each of the light-emitting elements 300 may be an inorganic light emitting diode having a size of micrometers or nanometers and made of an inorganic material. In case that an electric field is formed in a specific direction between two electrodes facing each other, the inorganic light emitting diode may be aligned between the two electrodes in which polarity may be formed. The light-emitting elements 300 may be aligned between two electrodes by an electric field formed on the electrodes.

Each of the light-emitting elements 300 may extend in a direction. Each of the light-emitting elements 300 may be shaped like a rod, a wire, a tube, or the like. In an embodiment, each of the light-emitting elements 300 may be shaped like a cylinder or a rod. However, the shape of each light-emitting element 300 is not limited thereto, and each of the light-emitting elements 300 may also have various shapes such as a cube, a rectangular parallelepiped and a hexagonal prism. Semiconductors included in each light-emitting element 300 which will be described later may be sequentially disposed or stacked on each other along a direction of a light-emitting element.

Each of the light-emitting elements 300 may include a semiconductor crystal doped with impurities of any conductivity type (e.g., a p type or an n type). The semiconductor crystal may receive an electrical signal from an external power source and emit light in a specific wavelength band.

Figure 7:
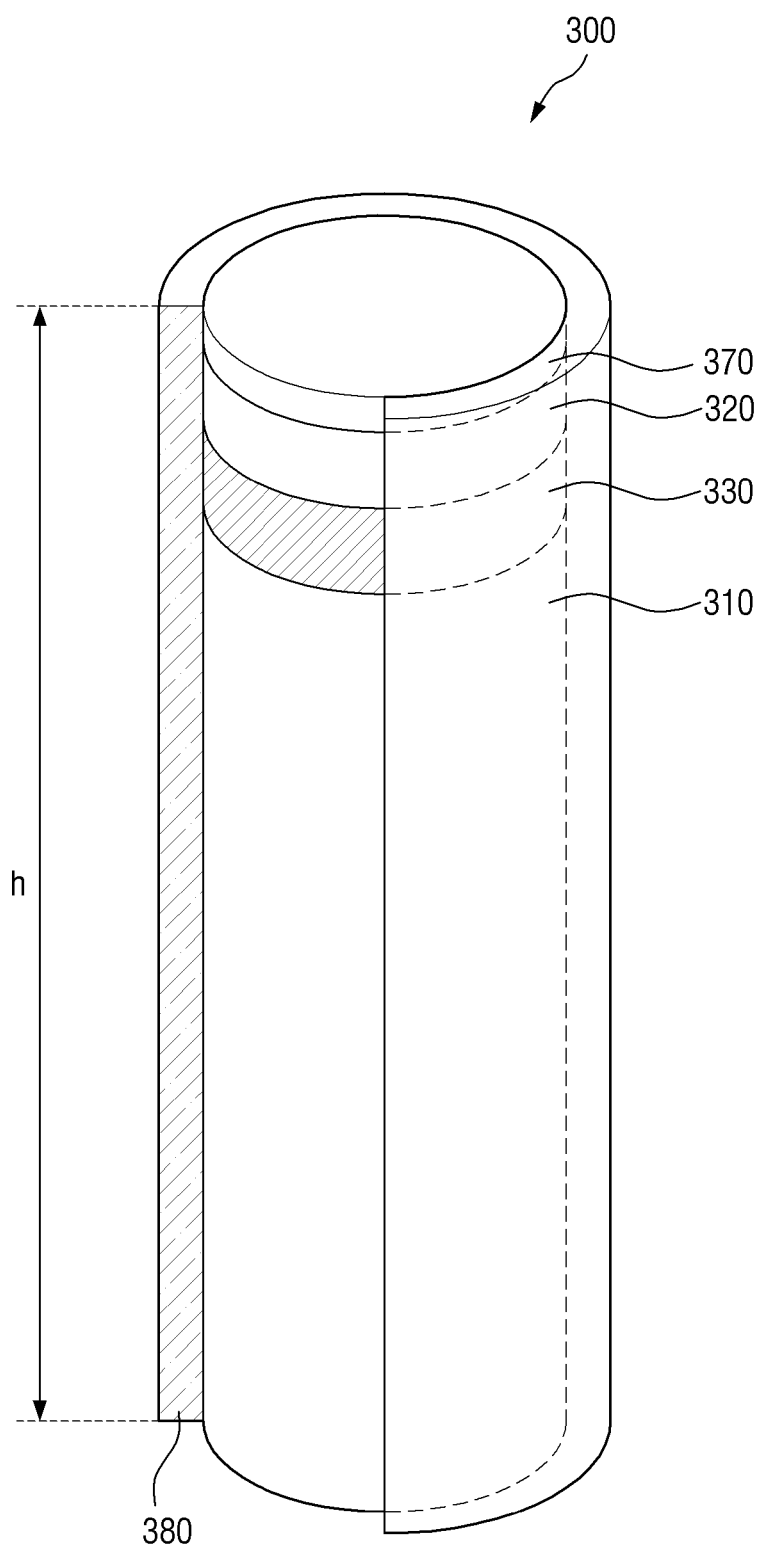
FIG. 7 is a schematic view of a light-emitting element according to an embodiment.

FIG. 7 is a schematic view of a light-emitting element according to an embodiment.

The light-emitting element 300 according to an embodiment may emit light in a specific wavelength band. In an embodiment, light emitted from an active layer 330 may be blue light whose central wavelength band may be in the range of about 450 nm to about 495 nm. However, the central wavelength band of the blue light is not limited to the above range and should be understood to include all wavelength ranges that can be recognized as blue in the art to which the disclosure pertains. Light emitted from the active layer 330 of the light-emitting element 300 is not limited thereto and may also be green light whose central wavelength band may be in the range of about 495 nm to about 570 nm or red light whose central wavelength band may be in the range of about 620 nm to about 750 nm.

Referring to FIG. 7, the light-emitting element 300 according to an embodiment may include a first conductivity type semiconductor 310, a second conductivity type semiconductor 320, the active layer 330, and an insulating film 380. The light-emitting element 300 according to an embodiment may further include at least one conductive electrode layer 370. Although the light-emitting element 300 further includes one conductive electrode layer 370 in FIG. 7, the disclosure is not limited thereto. In some cases, each of the light-emitting element 300 may include more conductive electrode layers 370, or the conductive electrode layer 370 may be omitted. The following description of the light-emitting element 300 may apply equally even if the light-emitting element 300 includes a different number of conductive electrode layers 370 or further includes another structure.

The first conductivity type semiconductor 310 may be, for example, an n-type semiconductor having a first conductivity type. In an example, in case that the light-emitting element 300 emits light in a blue wavelength band, the first conductivity type semiconductor 310 may include a semiconductor material having a chemical formula of $Al_xGa_yIn_{1-x-y}N$ ($0 \leq x \leq 1$, $0 \leq y \leq 1$, $0 \leq x+y \leq 1$), for example, may be any one or more of n-type doped AlGaInN, GaN, AlGaN, InGaN, AlN, and InN. The first conductivity type semiconductor 310 may be doped with a first conductivity type dopant, and the first conductivity type dopant may be, for example, Si, Ge, or Sn. In an embodiment, the first conductivity type semiconductor 310 may be n-GaN doped with n-type Si. A length of the first conductivity type semiconductor 310 may be in the range of, but not limited to, about 1.5 μm to about 5 μm.

The second conductivity type semiconductor 320 may be disposed on the active layer 330 to be described later. The second conductivity type semiconductor 320 may be, for example, a p-type semiconductor having a second conductivity type. In an example, in case that the light-emitting element 300 emits light in a blue or green wavelength band, the second conductivity type semiconductor 320 may include a semiconductor material having a chemical formula of $Al_xGa_yIn_{1-x-y}N$ ($0 \leq x \leq 1$, $0 \leq y \leq 1$, $0 \leq x+y \leq 1$), for example, may be any one or more of p-type doped AlGaInN, GaN, AlGaN, InGaN, AlN, and InN. The second conductivity type semiconductor 320 may be doped with a second conductivity type dopant, and the second conductivity type dopant may be, for example, Mg, Zn, Ca, Se, or Ba. In an embodiment, the second conductivity type semiconductor 320 may be p-GaN doped with p-type Mg. A length of the second conductivity type semiconductor 320 may be in the range of, but not limited to, about 0.08 μm to about 0.25 μm.

Although each of the first conductivity type semiconductor 310 and the second conductivity type semiconductor 320 may be composed of one layer in the drawing, the disclosure is not limited thereto. In some cases, each of the first conductivity type semiconductor 310 and the second conductivity type semiconductor 320 may include more layers, for example, may further include a clad layer or a tensile strain barrier reducing (TSBR) layer depending on the material of the active layer 330.

The active layer 330 may be disposed between the first conductivity type semiconductor 310 and the second conductivity type semiconductor 320. The active layer 330 may include a material having a single or multiple quantum well structure. In case that the active layer 330 includes a material having a multiple quantum well structure, it may have a structure in which quantum layers and well layers may be alternately stacked on each other. The active layer 330 may emit light through combination of electron-hole pairs according to an electrical signal received through the first conductivity type semiconductor 310 and the second conductivity type semiconductor 320. For example, in case that the active layer 330 emits light in the blue wavelength band, it may include a material such as AlGaN, AlGaInN, or a combination thereof. In particular, in case that the active layer 330 has a multiple quantum well structure in which a quantum layer and a well layer may be alternately stacked on each other, the quantum layer may include a material such as AlGaN, AlGaInN, or a combination thereof, and the well layer may include a material such as GaN, AlInN, or a combination thereof. In an embodiment, the active layer 330 may include AlGaInN as a quantum layer and AlInN as a well layer to emit blue light whose central wavelength band may be in the range of about 450 nm to about 495 nm as described above.

However, the disclosure is not limited thereto, and the active layer 330 may also have a structure in which a semiconductor material having a large band gap energy and a semiconductor material having a small band gap energy may be alternately stacked on each other or may include different group 3 to 5 semiconductor materials depending on the wavelength band of light that it emits. Light emitted from the active layer 330 is not limited to light in the blue wavelength band. In some cases, the active layer 330 may emit light in a red or green wavelength band. A length of the active layer 330 may be in the range of, but not limited to, about 0.05 μm to about 0.25 μm.

Light emitted from the active layer 330 may be radiated not only to an outer surface of the light-emitting element 300 in a longitudinal direction, but also to both side surfaces. The direction of light emitted from the active layer 330 is not limited to one direction.

The conductive electrode layer 370 may be an ohmic contact electrode. However, the disclosure is not limited thereto, and the conductive electrode layer 370 may also be a Schottky contact electrode. The conductive electrode layer 370 may include a conductive metal. For example, the conductive electrode layer 370 may include at least one of aluminum (Al), titanium (Ti), indium (In), gold (Au), silver (Ag), indium tin oxide (ITO), indium zinc oxide (IZO), and indium tin zinc oxide (ITZO). The conductive electrode layer 370 may include an n-type or p-type doped semiconductor material. The conductive electrode layer 370 may include the same material or different materials, but the disclosure is not limited thereto.

The insulating film 380 may surround outer surfaces of the semiconductors described above. In an embodiment, the insulating film 380 may surround an outer surface of at least the active layer 330 and extend in the direction in which the light-emitting element 300 extends. The insulating film 380 may protect the above members. For example, the insulating film 380 may surround side surfaces of the above members but may expose both ends of the light-emitting element 300 in the longitudinal direction.

In the drawing, the insulating film 380 extends in the longitudinal direction of the light-emitting element 300 to cover from the first conductivity type semiconductor 310 to the conductive electrode layer 370. However, the disclosure is not limited thereto, and the insulating film 380 may also cover outer surfaces of only some conductivity type semiconductors as well as the active layer 330 or may cover only a part of an outer surface of the conductive electrode layer 370 to partially expose the outer surface of the conductive electrode layer 370.

A thickness of the insulating film 380 may be in the range of, but not limited to, about 10 nm to about 1.0 µm. For example, the thickness of the insulating film 380 may be about 40 nm.

The insulating film 380 may include a material having insulating properties such as silicon oxide (SiOx), silicon nitride (SiNx), silicon oxynitride (SiOxNy), aluminum nitride (AlN), aluminum oxide (Al2O3), or a combination thereof. Therefore, the insulating film 380 can prevent an electrical short circuit that may occur in case that the active layer 330 directly contacts an electrode through which an electrical signal may be transmitted to the light-emitting element 300. The insulating film 380 can prevent a reduction in luminous efficiency by protecting the outer surface of the light-emitting element 300 including the active layer 330.

In some embodiments, an outer surface of the insulating film 380 may be treated. In case that the display device 10 may be manufactured, the light-emitting element 300 may be sprayed on an electrode in a state in which it may be dispersed in an ink and may be aligned. Here, the surface of the insulating film 380 may be hydrophobic or hydrophilic-treated so that the light-emitting element 300 remains separate from other adjacent light-emitting elements 300 in the ink without being agglomerated with them.

A length h of the light-emitting element 300 may be in the range of about 1 µm to about 10 µm or about 2 µm to about 6 µm or about 4 to about 5 µm. A diameter of the light-emitting element 300 may be in the range of about 300 nm to about 700 nm, and an aspect ratio of the light-emitting element 300 may be about 1.2 to about 100. However, the disclosure is not limited thereto, and light-emitting elements 300 included in the display device 10 may also have different diameters according to a difference in composition of the active layer 330. The diameter of the light-emitting element 300 may be about 500 nm.

According to an embodiment, in at least some light-emitting elements 300, the first conductivity type semiconductor 310, the active layer 330, and the second conductivity type semiconductor 320 may be sequentially disposed along the third direction DR3 in which the first electrode 210 and the second electrode 220 face each other. Referring to FIGS. 6 and 7, the light-emitting elements 300 may be disposed between the first electrode 210 and the second electrode 220, and the direction in which the light-emitting elements 300 extend may be aligned parallel to the third direction DR3, like the second light-emitting elements 302.

In each light-emitting element 300, since the first conductivity type semiconductor 310, the active layer 330 and the second conductivity type semiconductor 320 may be sequentially disposed along the extending direction of the light-emitting element 300, the first conductivity type semiconductor 310, the active layer 330 and the second conductivity type semiconductor 320 may be, according to an embodiment, disposed along the third direction DR3 in which the first electrode 210 and the second electrode 220 face each other.

According to an embodiment, the insulating film 380 of each light-emitting element 300 may partially contact the first insulating layer 510. As illustrated in FIG. 6, the outer surface of each light-emitting element 300 excluding the first end in contact with the first electrode 210 and the second end in contact with the second electrode 220 may be surrounded by the first insulating layer 510. Each light-emitting element 300 includes the insulating film 380 which protects the first conductivity type semiconductor 310 and the second conductivity type semiconductor 320 as well as the active layer 330. The active layer 330 from which light may be emitted in each light-emitting element 300 may be surrounded and protected by the insulating film 380 and the first insulating layer 510. The insulating films 380 and the first insulating layer 510 may be disposed between the active layers 330 of adjacent light-emitting elements 300.

A method of manufacturing the display device 10 according to an embodiment will now be described.

Figure 8:
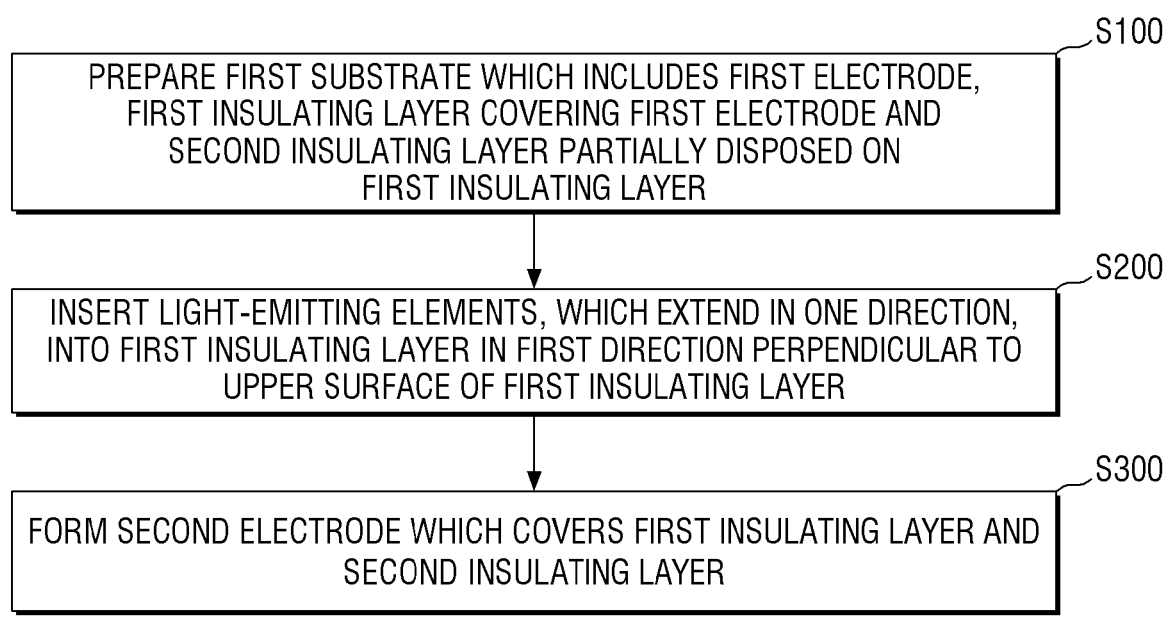
FIG. 8 is a schematic flowchart illustrating a method of manufacturing a display device according to an embodiment.

FIG. 8 is a schematic flowchart illustrating a method of manufacturing a display device according to an embodiment.

Referring to FIG. 8, the method of manufacturing the display device 10 according to an embodiment includes preparing a base part SUB1 which may include a first electrode 210, a first insulating layer 510 covering the first electrode 210 and a second insulating layer 520 partially disposed on the first insulating layer 510 (operation S100), inserting light-emitting elements 300, which extend in one direction, into the first insulating layer 510 in the third direction DR3 perpendicular to an upper surface of the first insulating layer 510 (operation S200), and forming a second electrode 220 which covers the first insulating layer 510 and the second insulating layer 520 (operation S300).

As described above, the process of manufacturing the display device 10 may include spraying the light-emitting elements 300 on an opening area 520P and the first insulating layer 510 on which the second insulating layer 520 may be disposed, aligning the light-emitting elements 300 in a direction, and inserting the light-emitting elements 300 into the first insulating layer 510. The inserting of the light-emitting elements 300 into the first insulating layer 510 may be performed through a physical method, and examples of the physical method are not limited. The method of manufacturing the display device 10 will now be described in detail with reference to other drawings.

FIGS. 9 through 17 are schematic cross-sectional views illustrating a process of manufacturing a display device according to an embodiment.

Figure 9:
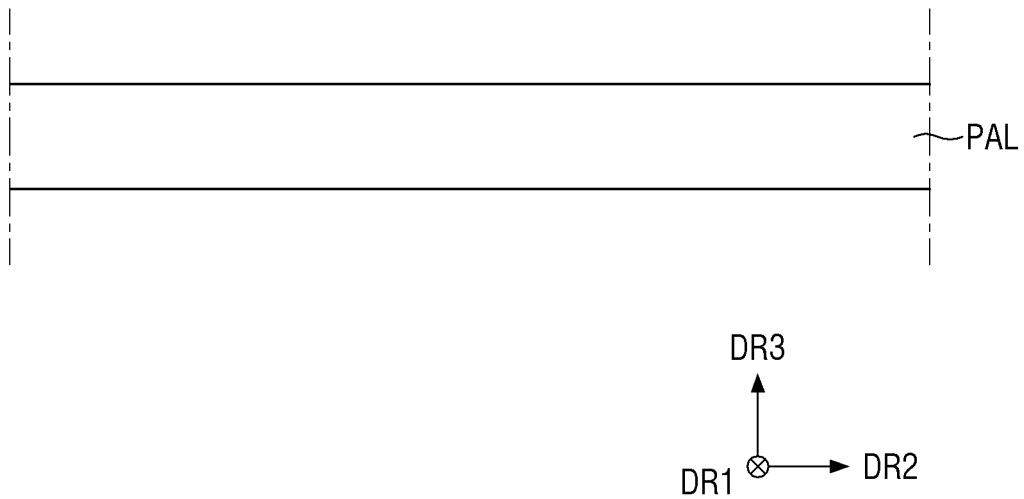
FIGS. 9 through 17 are schematic cross-sectional views illustrating a process of manufacturing a display device according to an embodiment.

First, referring to FIG. 9, a circuit element layer PAL may be prepared. The circuit element layer PAL may include a substrate 110, a buffer layer 115, and transistors 120 and 140. These elements may be the same as those described above and thus will not be described in detail.

Figure 10:
Figure 11:
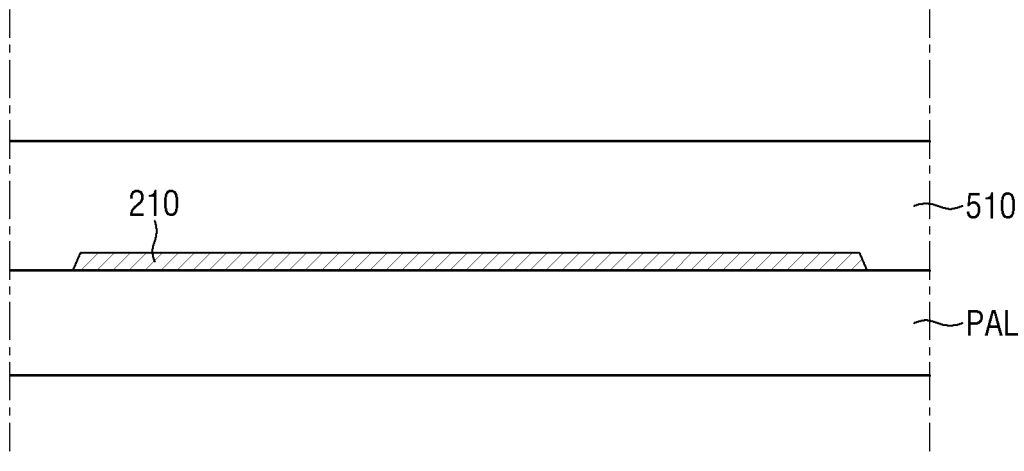
Figure 11:
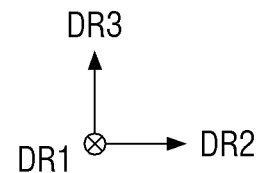
Figure 12:
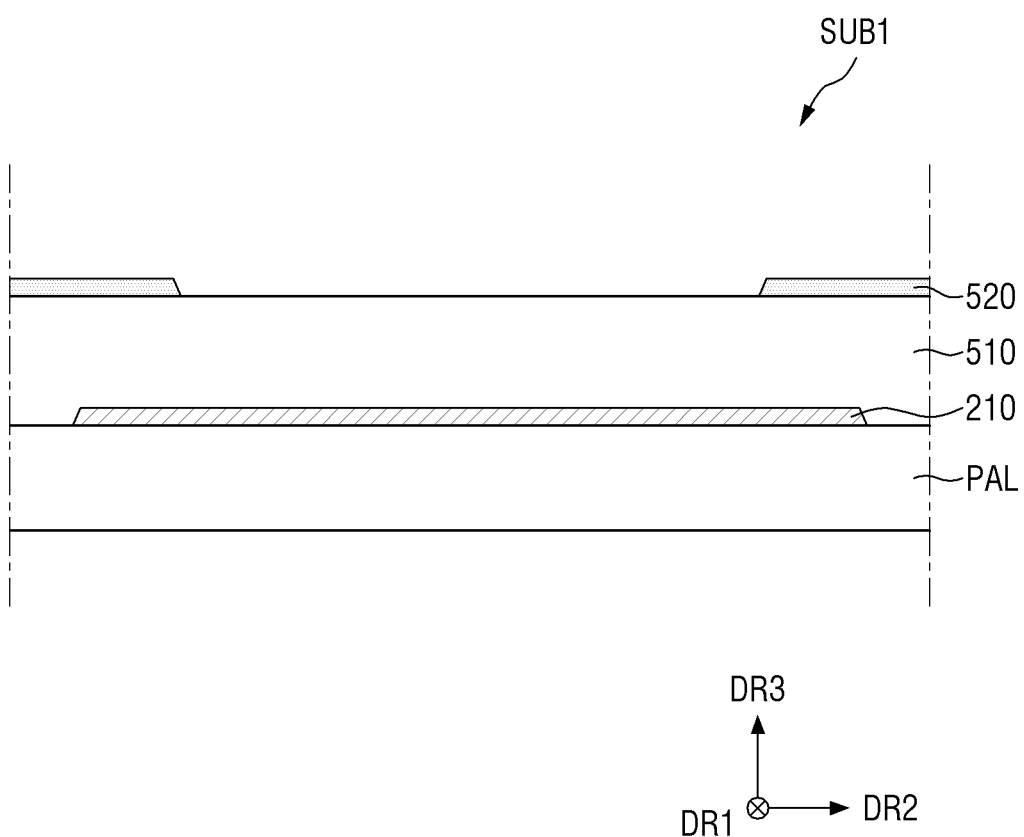

Referring to FIGS. 10 through 12, a base part SUB1 including a first electrode 210, a first insulating layer 510 and a second insulating layer 520 disposed on the circuit element layer PAL may be formed. The first electrode 210, the first insulating layer 510, and the second insulating layer 520 of the base part SUB1 may be the same as those described above and thus will not be described below.

Figure 13:
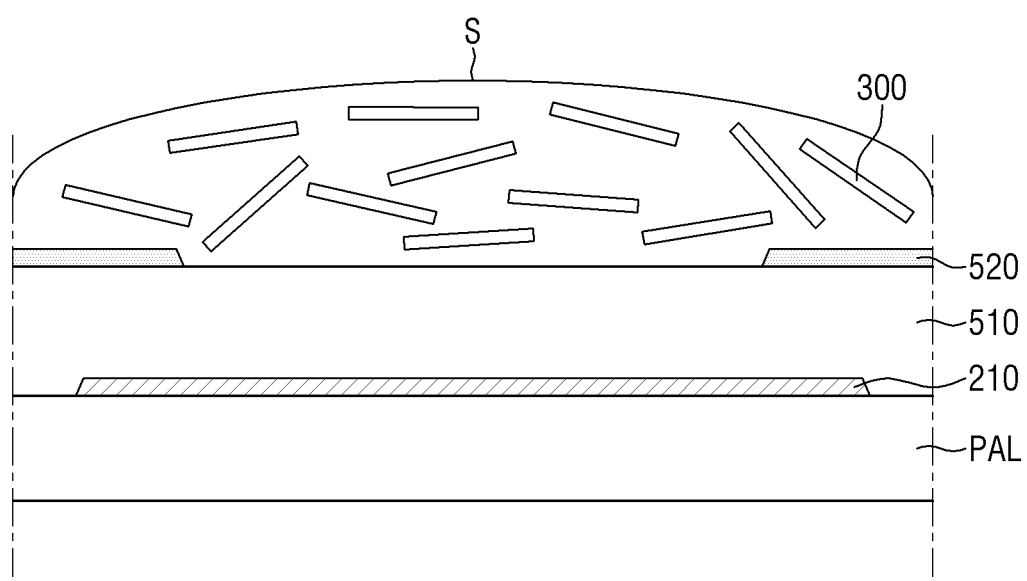
Figure 13:
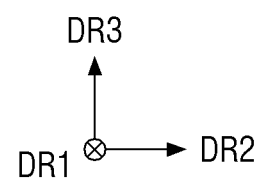

Referring to FIG. 13, light-emitting elements 300 may be sprayed on the first electrode 210. The light-emitting elements 300 may be sprayed on the first insulating layer 510 and the second insulating layer 520 disposed on the first electrode 210, and some of the light-emitting elements 300 may be sprayed on the first insulating layer 510 exposed by an opening area 520P while the others may be sprayed on the second insulating layer 520. In an embodiment, the light-emitting elements 300 may be sprayed in a state where they may be dispersed in an ink S. The ink S may be provided in a solution or colloidal state. For example, the ink S may be, but is not limited to, acetone, water, alcohol, toluene, propylene glycol (PG), propylene glycol methyl acetate (PGMA), or a combination thereof. In some cases, the light-emitting elements 300 may be sprayed on the first electrode 210 in a state where they may not be dispersed in the ink S.

The light-emitting elements 300 may be sprayed on the first electrode 210, for example, on the first insulating layer 510 or the second insulating layer 520 in a state where they may be dispersed in the ink S. The light-emitting elements 300 may extend in a direction but may exist in the ink S not in a specific direction but in random directions.

Figure 14:
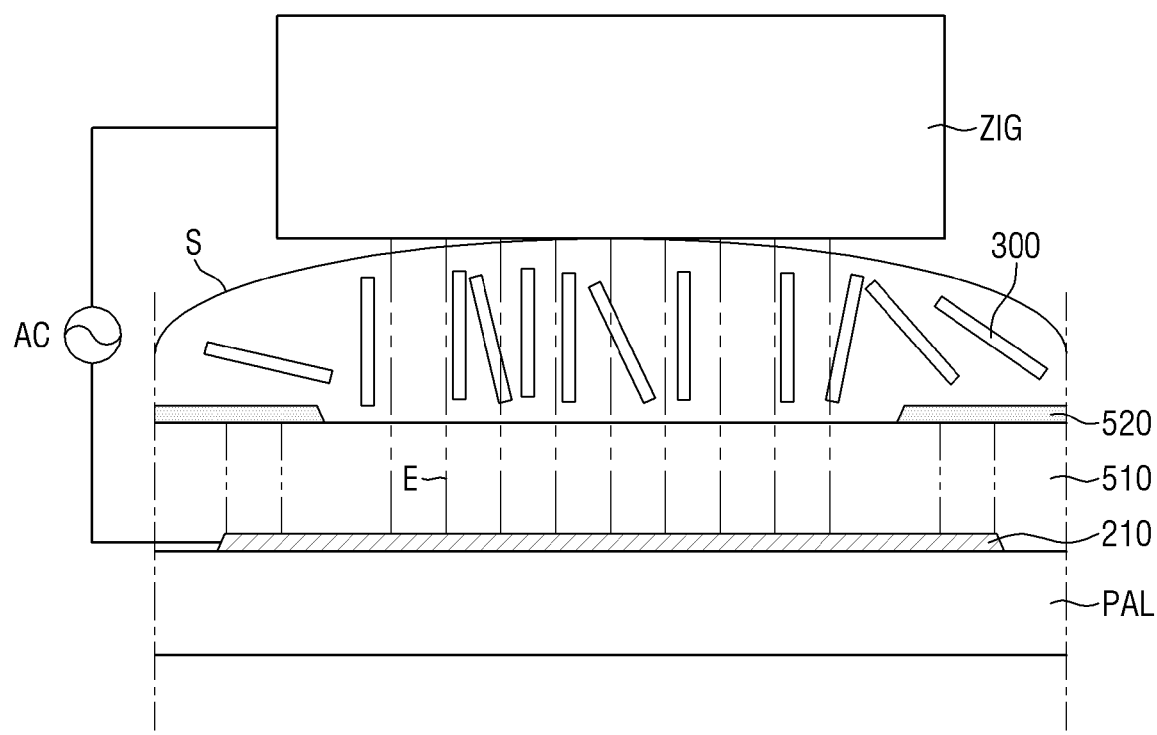
Figure 14:
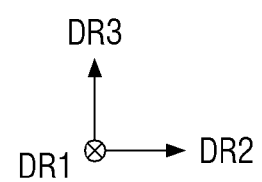

Referring to FIG. 14, an electric field E may be formed on the first electrode 210 to align the light-emitting elements 300 such that the direction in which the light-emitting elements 300 extend may be parallel to the third direction DR3. The first electrode 210 may be utilized as an alignment electrode for aligning the light-emitting elements 300. A jig unit ZIG to which an alignment signal may be transmitted may be positioned on the ink S sprayed on the first electrode 210, and power (e.g., alternating current (AC) power) may be applied to the first electrode 210 and the jig unit ZIG. In case that the AC power is applied to the first electrode 210 and the jig unit ZIG, the electric field E may be formed therebetween, and the light-emitting elements 300 may be subjected to a dielectrophoretic force applied by the electric field E.

The orientation direction and position of the light-emitting elements 300 subjected to the dielectrophoretic force may change according to the direction of the electric field E or the polarity direction. As illustrated in FIG. 14, the light-emitting elements 300 may be aligned by the electric field E formed between the first electrode 210 and the jig unit ZIG such that their extending direction may be parallel to the third direction DR3. However, since the electric field E may be blocked in an area in which the second insulating layer 520 may be disposed between the first electrode 210 and the jig unit ZIG, the light-emitting elements 300 may not be aligned in this area. The light-emitting elements 300 located in the opening area 520P in which the second insulating layer 520 may not be disposed may be aligned such that their extending direction may be parallel to the third direction DR3, but the light-emitting elements 300 located on the second insulating layer 520 may not be aligned but may be in random directions.

Figure 15:
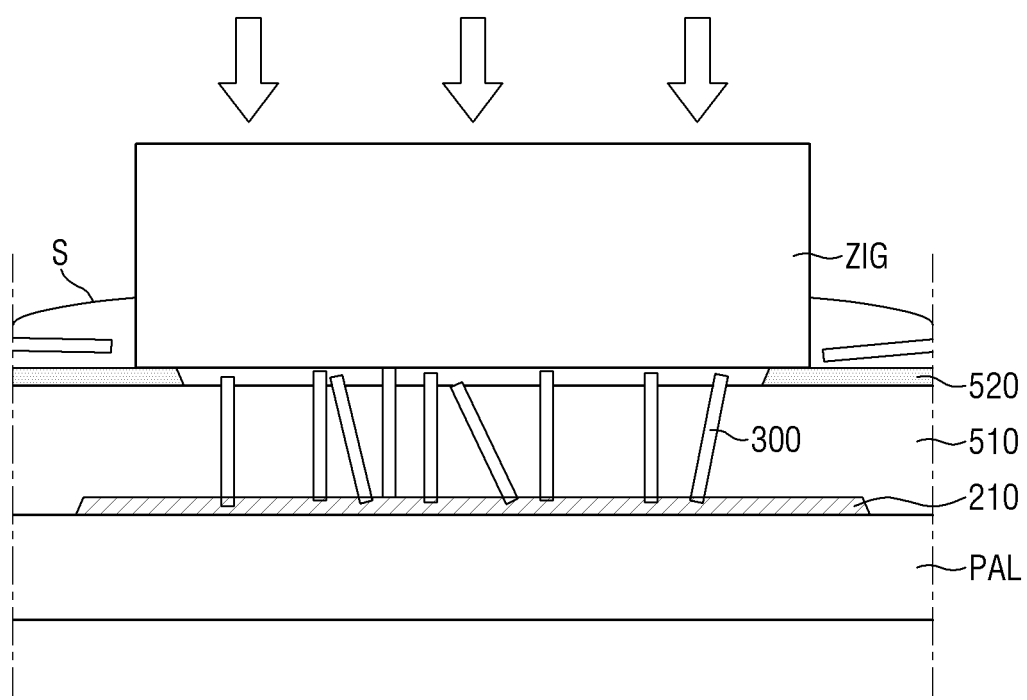

Referring to FIG. 15, the light-emitting elements 300 may be inserted into the first insulating layer 510 in the third direction DR3. The inserting of the light-emitting elements 300 may include physically inserting the light-emitting elements 300 using the jig unit ZIG. As illustrated in FIG. 15, the inserting of the light-emitting elements 300 may be performed through a process of moving the jig unit ZIG in a downward direction which may be the third direction DR3. The jig unit ZIG may move in the third direction DR3 until its lower surface touches an upper surface of the second insulating layer 520, and the light-emitting elements 300 aligned in the third direction DR3 in the opening area 520P may be inserted into the first insulating layer 510. However, the inserting of the light-emitting elements 300 is not limited thereto and may also be performed by an inserting process using other physical methods.

As described above, the light-emitting elements 300 located in the opening area 520P may be aligned parallel to the third direction DR3 by the electrode field E and thus inserted into the first insulating layer 510 by the movement of the jig unit ZIG. The light-emitting elements 300 located on the second insulating layer 520 may remain without being inserted into the first insulating layer 510.

Figure 16:
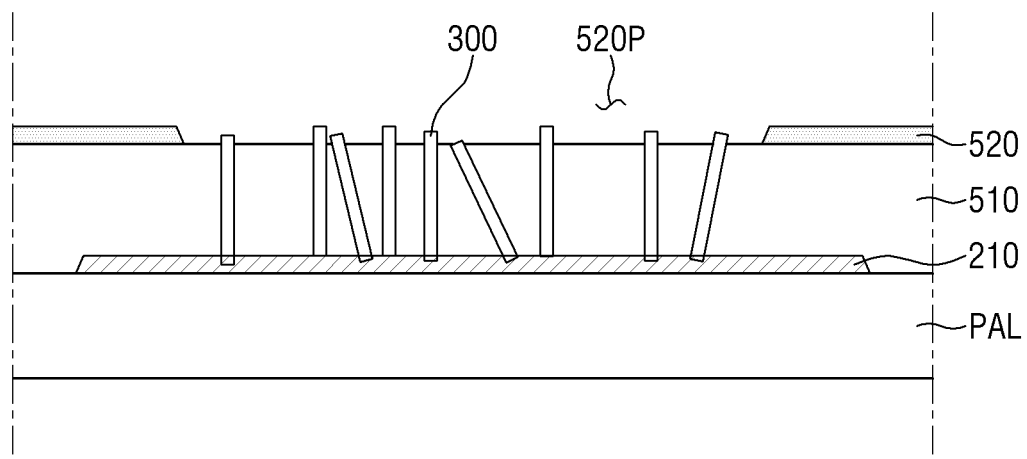
Figure 16:
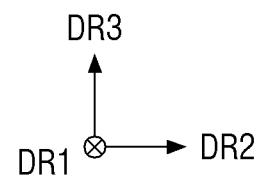

Referring to FIG. 16, the light-emitting elements 300 sprayed on the second insulating layer 520 may be removed. In case that the light-emitting elements 300 are inserted into the first insulating layer 510, the light-emitting elements 300 that may not be inserted or remain on the second insulating layer 520 may be removed by cleaning. In this process, the ink S in which the light-emitting elements 300 may be dispersed may also be removed. Accordingly, the light-emitting elements 300 not inserted into the first insulating layer 510 may be removed, and light-emitting elements 300 remaining in each pixel PX or subpixel PXn of the display device 10 without emitting light can be prevented from being seen from the outside.

Figure 17:
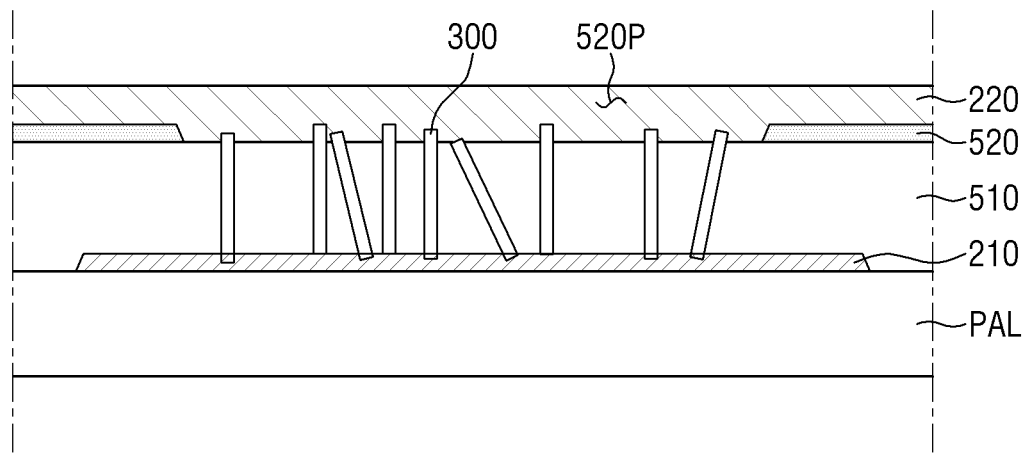
Figure 17:
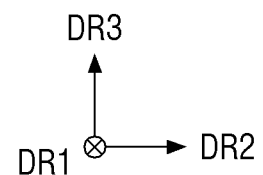

Referring to FIG. 17, a second electrode 220 may be formed to cover the first insulating layer 510 and the second insulating layer 520, and a passivation layer 550 may be formed on the second electrode 220, thereby manufacturing the display device 10. The second electrode 220 and the passivation layer 550 may be the same as those described above and thus will not be described in detail below.

The display device 10 may include subpixels PXn, and the first electrode 210 may be disposed in each subpixel PXn. As described above, the first electrode 210 may be spaced apart from the first electrode 210 of an adjacent subpixel PXn, and the second electrode 220 may be entirely disposed in a display area DA. In the display device 10 according to an embodiment, the first electrodes 210 of adjacent subpixels PXn may be formed as a single layer and may be spaced apart from each other by a process of partially cutting the single layer during the manufacturing process of the display device 10.

Figure 18:
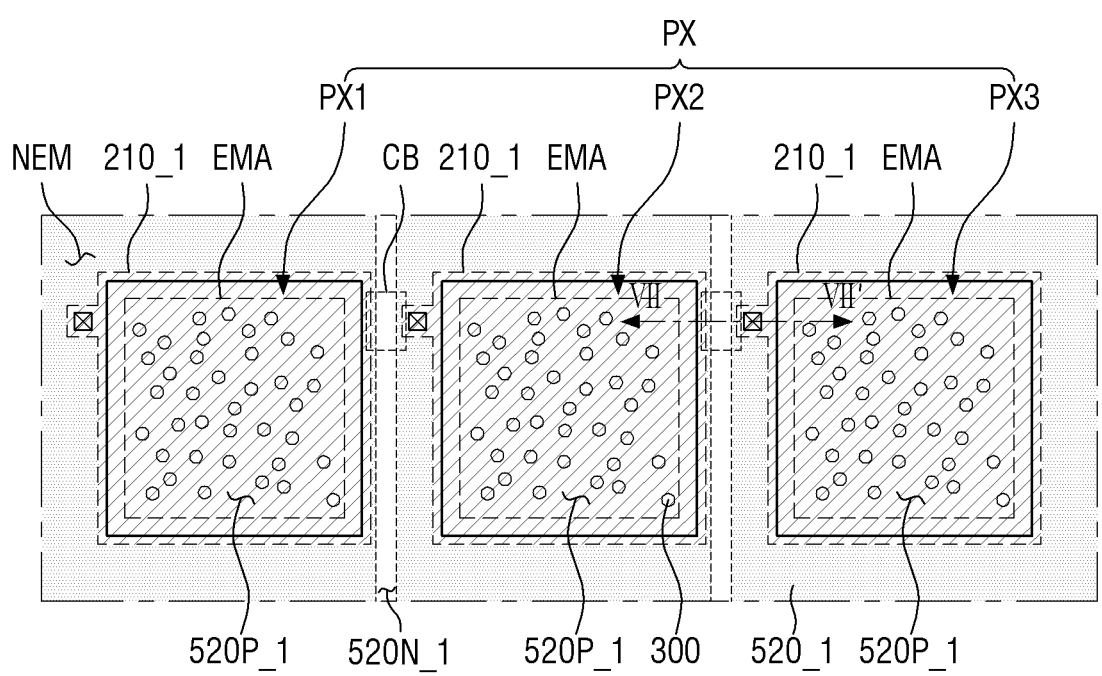
FIG. 18 is a schematic plan view of a pixel of a display device according to another embodiment.
Figure 19:
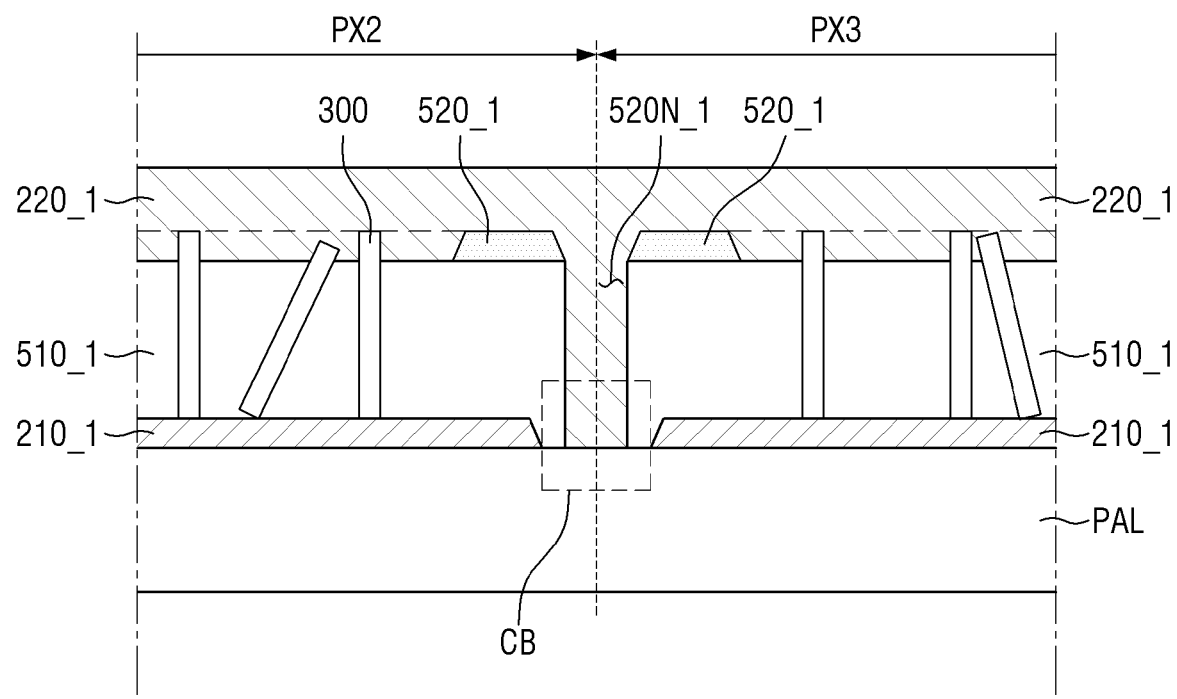
FIG. 19 is a schematic cross-sectional view taken along line VII-VII' of FIG. 18.
Figure 19:
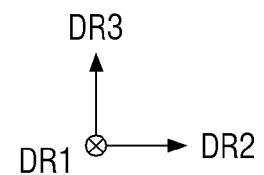

FIG. 18 is a schematic plan view of a pixel of a display device according to another embodiment. FIG. 19 is a schematic cross-sectional view taken along line VII-VII' of FIG. 18.

Referring to FIGS. 18 and 19, the display device according to an embodiment may include a hole 520N_1 extending in a direction at a boundary between adjacent subpixels PXn. In the drawings, the hole 520N_1 extends in the first direction DR1 between a first subpixel PX1 and a second subpixel PX2 and between the second subpixel PX2 and a third subpixel PX3, but the disclosure is not limited thereto.

In some cases, the hole 520N_1 may extend in the first direction DR1 and the second direction DR2 and may be disposed at boundaries between subpixels PXn. The display device 10_1 of FIGS. 18 and 19 may be the same as the display device 10 of FIGS. 2 and 3 except for the shapes of a first insulating layer 510_1, a second insulating layer 520_1, and a second electrode 220_1 due to the hole 520N_1 that may be included in the display device 10_1. Thus, any redundant description will be omitted, and differences will be described in detail below.

First electrodes 210_1 may be disposed in the second subpixel PX2 and the third subpixel PX3, respectively, and may be spaced apart from each other in the second direction DR2. The second electrode 220_1 may be entirely disposed on the second pixel PX2 and the third subpixel PX3. For example, the second electrode 220_1 may face the first electrode 210_1 of the second subpixel PX2 and the first electrode 210_1 of the third subpixel PX3 in the third direction DR3, and light-emitting elements 300 may be disposed between the second electrode 220_1 and the first electrode 210_1 of the second subpixel PX2 and between the second electrode 220_1 and the first electrode 210_1 of the third subpixel PX3.

The first electrode 210_1 of the second subpixel PX2 and the first electrode 210_1 of the third subpixel PX3 may be spaced apart from each other at a boundary between the second subpixel PX2 and the third subpixel PX3. Unlike in FIGS. 2 and 3, in the display device 10_1 of FIGS. 18 and 19, parts of the first insulating layer 510_1 and the second insulating layer 520_1 may also be spaced apart at the boundary between the second subpixel PX2 and the third subpixel PX3 to form the hole 520N_1.

In the display device 10 of FIGS. 2 and 3, a separate first electrode 210 may be formed for each subpixel PXn. Therefore, in case that an electric field E is formed on the first electrode 210 (see FIG. 14), a separate alignment signal may be transmitted to the first electrode 210 of each subpixel PXn. However, the disclosure is not limited thereto. In case that the first electrodes 210_1 of adjacent subpixels PXn may be connected to each other, the electric field E formed by the alignment signal may be generated simultaneously for the subpixels PXn. The first electrode 210_1 of the second subpixel PX2 and the first electrode 210_1 of the third subpixel PX3 connected to each other may receive the alignment signal and may be separated from each other in a subsequent process along a cutting part CB located at the boundary between the second subpixel PX2 and the third subpixel PX3. The process of separating the first electrodes 210_1 along the cutting part CB may involve a process of partially etching the first insulating layer 510_1 and the second insulating layer 520_1. Accordingly, the hole 520N_1 may be formed at each boundary between the subpixels PXn.

Figure 20:
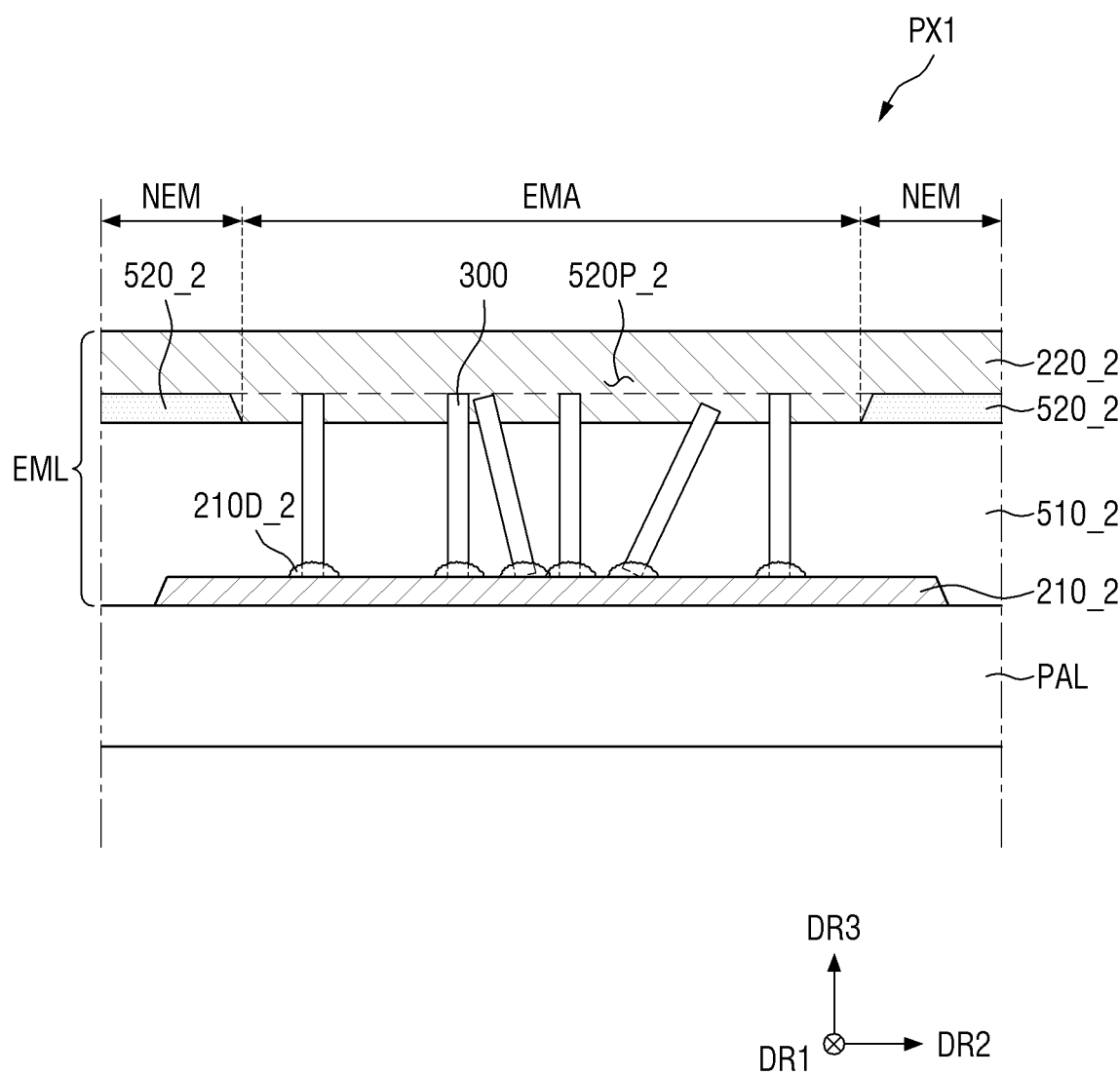
FIG. 20 is a schematic cross-sectional view of a display device according to another embodiment.

FIG. 20 is a schematic cross-sectional view of a display device according to another embodiment.

Referring to FIG. 20, according to an embodiment, a first electrode 210_2 may further include first electrode protrusions 210D_2 protruding from an upper surface and covering first ends of light-emitting elements 300. FIG. 20 may be the same as the display device 10 of FIG. 3 except that the first electrode 210_2 further includes the first electrode protrusions 210D_2. Thus, differences will be described in detail below.

The first ends of the light-emitting elements 300 which may contact the first electrode 210_2 may not smoothly contact the first electrode 210_2 depending on the direction in which the light-emitting elements 300 may be inserted into a first insulating layer 510_2. According to an embodiment, a process of applying heat to the first electrode 210_2 may be performed after a process of inserting the light-emitting elements 300 into the first insulating layer 510_2.

For example, in case that the first electrode 210_2 includes a metal material as a material having high reflectivity, the first electrode 210_2 may be partially melted by the process of applying heat. In case that the first electrode 210_2 is partially melted, the light-emitting elements 300 may finely move toward the first electrode 210_2, or the melted first electrode 210_2 may finely move toward the first ends of the light-emitting elements 300. In case that the melted first electrode 210_2 partially moves along outer surfaces of the light-emitting elements 300, some areas of the first electrode 210_2 may protrude from an upper surface of the first electrode 210_2 to form the first electrode protrusions 210D covering the first ends of the light-emitting elements 300. The first electrode protrusions 210D_2, like a second electrode 220_2, may be formed to cover the first ends of the light-emitting elements 300, thereby improving the contact between the light-emitting elements 300 and the first electrode 210_2.

Figure 21:
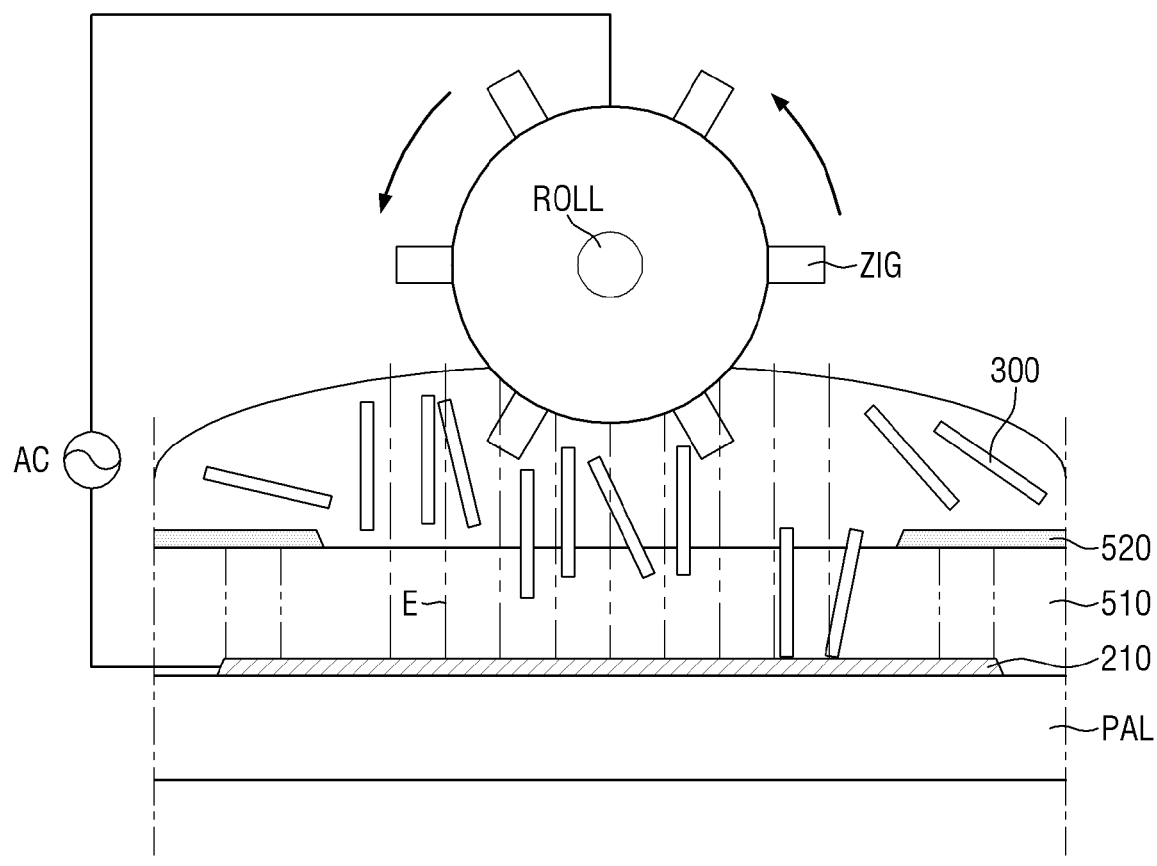
FIG. 21 is a schematic view illustrating a part of a process of manufacturing a display device according to another embodiment.
Figure 21:
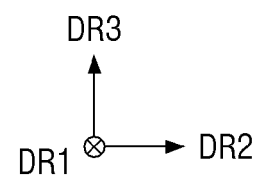
Figure 22:
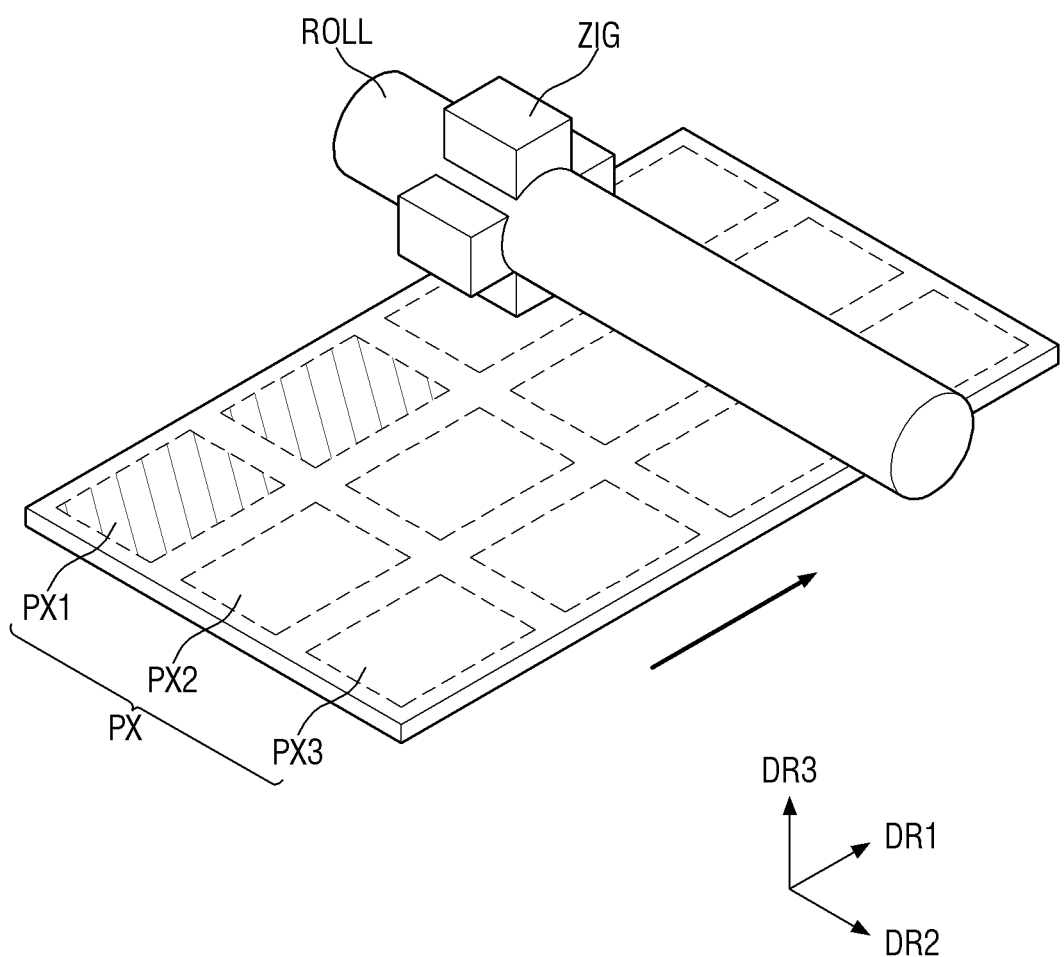
FIGS. 22 through 24 are schematic views illustrating a method of manufacturing a display device using the display device manufacturing process of FIG. 21.
Figure 23:
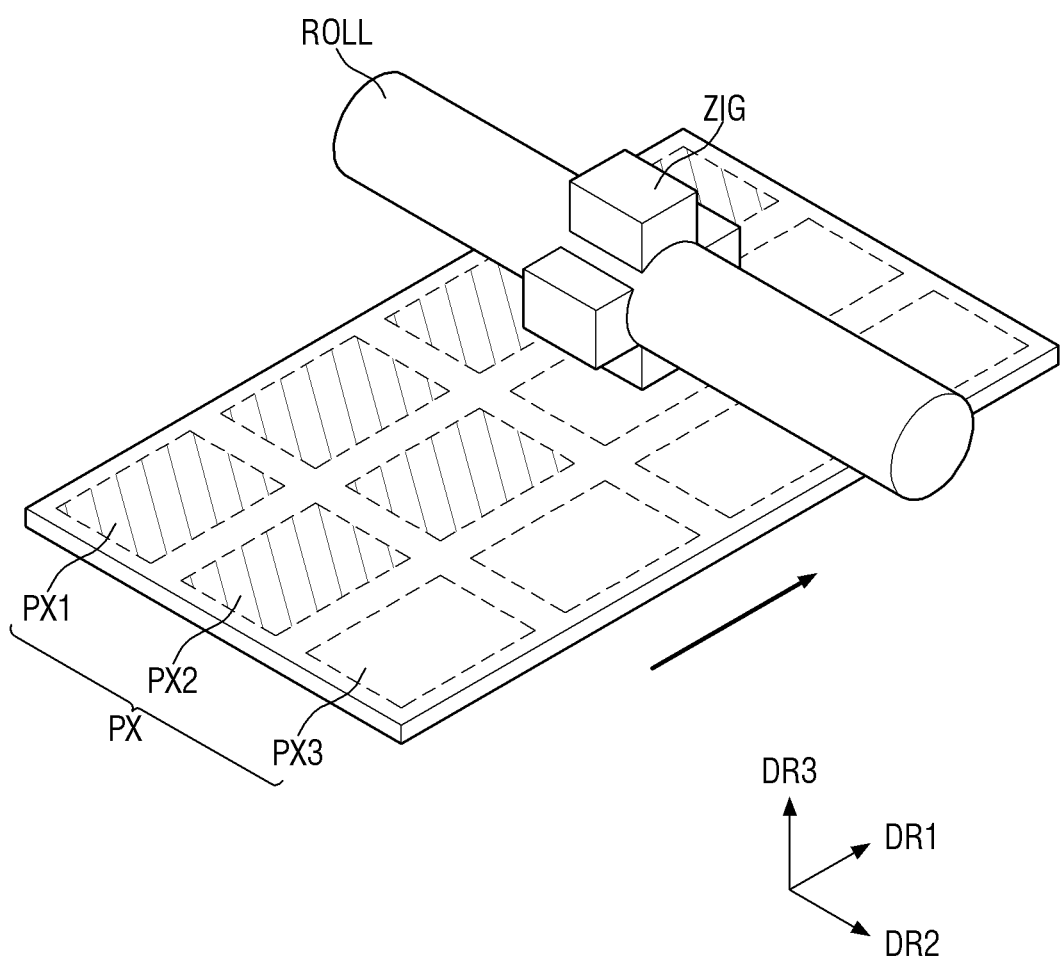
Figure 24:
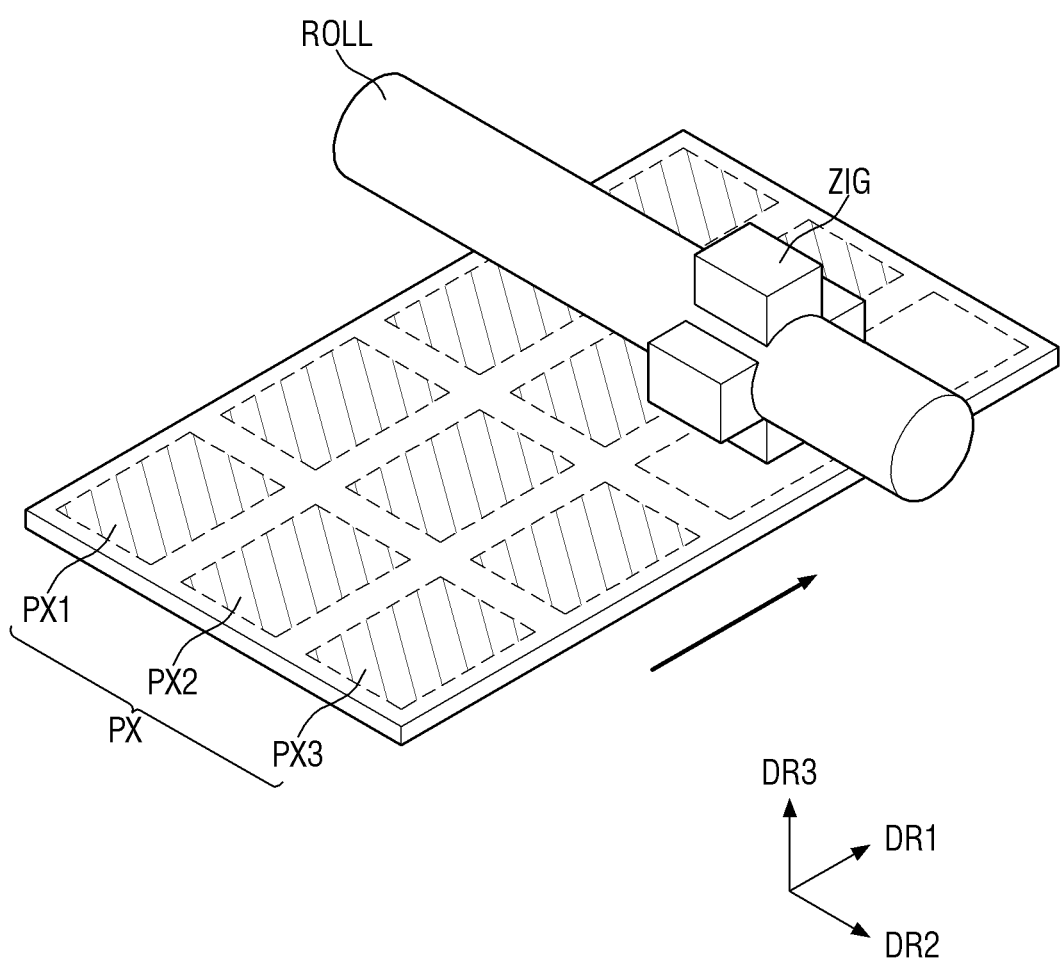

FIG. 21 is a schematic view illustrating a part of a process of manufacturing a display device according to another embodiment. FIGS. 22 through 24 are schematic views illustrating a method of manufacturing a display device using the display device manufacturing process of FIG. 21.

As described above, inserting light-emitting elements 300 into a first insulating layer 510 is not particularly limited. In an embodiment, the light-emitting elements 300 may be physically inserted into the first insulating layer 510 by a jig unit ZIG attached to a rotating roller device ROLL.

Referring to FIG. 21, in the inserting of the light-emitting elements 300 into the first insulating layer 510, in case that the roller device ROLL rotates in a direction, the jig unit ZIG attached to the roller ROLL may insert the light-emitting elements 300 into the first insulating layer 510. Unlike in FIG. 15, the roller device ROLL may move to an adjacent subpixel PXn while rotating in the direction and may sequentially insert the light-emitting elements 300 along subpixels PXn.

Referring to FIGS. 22 through 24, the roller device ROLL may move in a direction, for example, in the first direction DR1 while rotating. The jig unit ZIG attached to the roller device ROLL may successively insert the light-emitting elements 300 while moving along subpixels PXn arranged in the first direction DR1. Here, a subpixel PXn into which the light-emitting elements 300 are to be inserted may be determined according to the position of the jig unit ZIG of the roller device ROLL.

First, as illustrated in FIG. 22, in case that the jig unit ZIG of the roller device ROLL may be positioned above a first subpixel PX1, the light-emitting elements 300 may be inserted into the first insulating layer 510 in the first subpixel PX1 and subpixels PXn arranged in the first direction DR1 from the first subpixel PX1 as the roller device ROLL moves. On the other hand, the light-emitting elements 300 may not be inserted into a second subpixel PX2 and a third subpixel PX3 and subpixels PXn arranged in the first direction DR1 from the second subpixel PX2 and the third subpixel PX3 because the jig unit ZIG may not be located.

As illustrated in FIGS. 23 and 24, the roller device ROLL moves to position the jig unit ZIG above the second subpixel PX2 or the third subpixel PX3 and may move in the first direction DR1. Accordingly, the light-emitting elements 300 may be inserted into the first insulating layer 510 in the second subpixel PX2 or the third subpixel PX3 and the subpixels PXn arranged in the first direction DR1 from the second subpixel PX2 or the third subpixel PX3. In the method of manufacturing the display device 10 according to the embodiment, it may be possible to sequentially insert the light-emitting elements 300 into subpixels PXn arranged in a direction by using the roller device ROLL including the jig unit ZIG.

Figure 25:
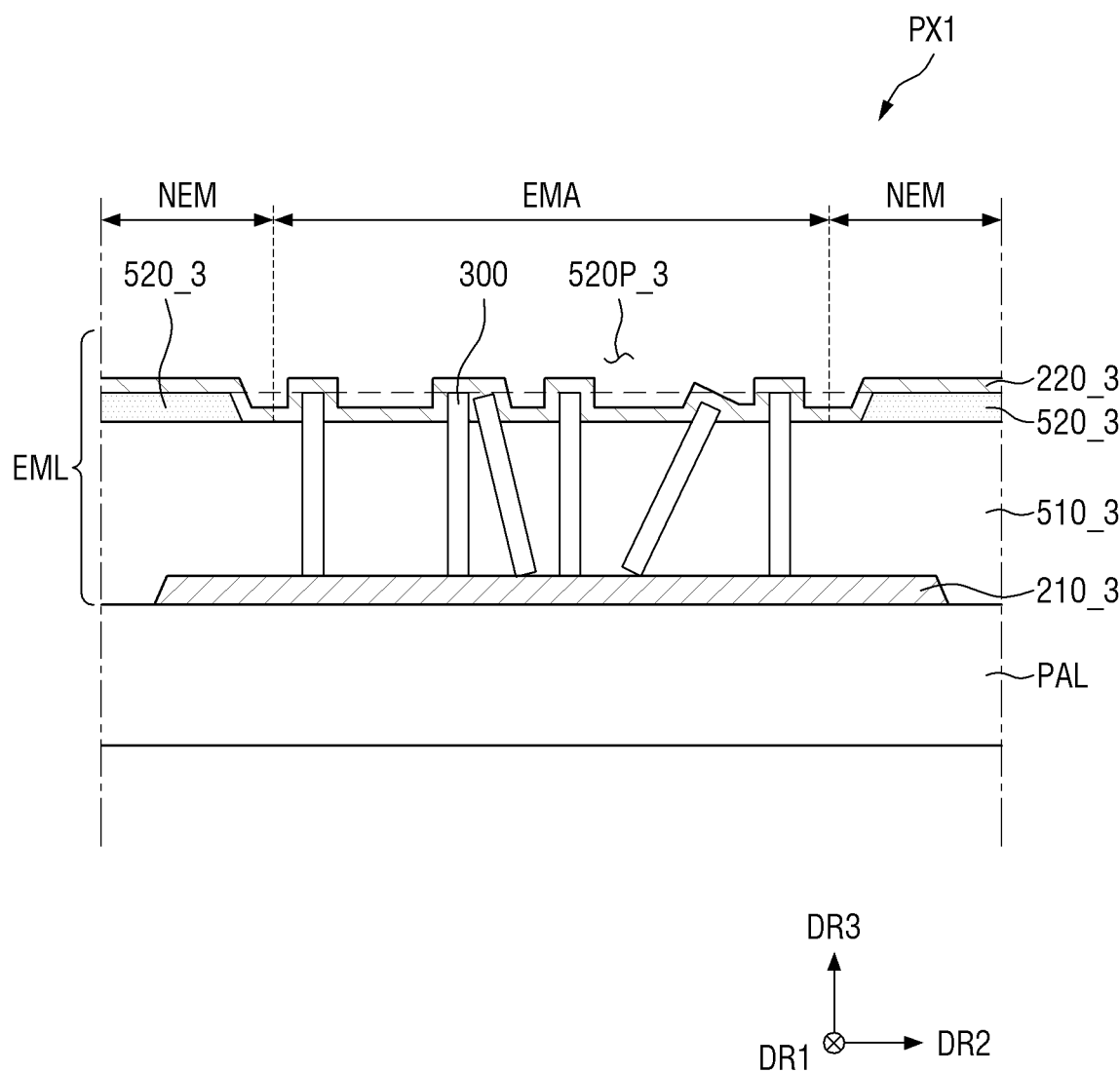
FIG. 25 is a schematic cross-sectional view of a display device according to another embodiment.

FIG. 25 is a schematic cross-sectional view of a display device according to another embodiment.

Referring to FIG. 25, a second electrode 220_3 according to an embodiment may be thinner than a second insulating layer 520_3. Accordingly, an upper surface of the second electrode 220_3 may not be flat but may have steps formed along a first insulating layer 510_3, the second insulating layer 520_3, and protruding ends of light-emitting elements 300.

Since the second electrode 220 of FIG. 3 may be thicker than the second insulating layer 520, its upper surface may form a flat surface at steps formed by the first insulating layer 510, the second insulating layer 520, and the second ends of the light-emitting elements 300. On the other hand, the second electrode 220_3 of FIG. 25 may have a relatively small thickness, for example, a thickness of about 0.1 μm and may be formed along the first insulating layer 510, the second insulating layer 520, and second ends of the light-emitting elements 300. Even if the upper surface of the second electrode 220_3 may not be flat, the second electrode 220_3 may be formed to cover the second ends of the light-emitting elements 300 and thus may smoothly contact the light-emitting elements 300. Although not illustrated in FIG. 25, a passivation layer 550 (see FIG. 4) may be disposed on the second electrode 220_3 to form a flat upper surface.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
a first electrode;
a first insulating layer disposed on the first electrode;
a second electrode disposed on the first insulating layer, at least a part of the second electrode facing the first electrode in a first direction;
one or more first light-emitting elements disposed between the first electrode and the second electrode, the one or more first light-emitting elements extending in a direction,
wherein the first insulating layer partially covers outer surfaces of the one or more first light-emitting elements, and
wherein at least one of the one or more first light-emitting elements extends parallel to the first direction.

2. The display device of claim 1, wherein
first ends of the one or more first light-emitting elements contact the first electrode, and
second ends of the one or more first light-emitting elements contact the second electrode.

3. The display device of claim 2, wherein an acute angle formed by the direction in which the one or more first light-emitting elements extend and a second direction perpendicular to the first direction is in the range of about 80 degrees up to and including 90 degrees.

4. The display device of claim 3, wherein
each of the one or more first light-emitting elements comprises:
a first conductivity type semiconductor;
a second conductivity type semiconductor; and
an active layer disposed between the first conductivity type semiconductor and
the second conductivity type semiconductor, and
the first conductivity type semiconductor, the active layer, and the second conductivity type semiconductor are sequentially disposed along the first direction in at least one of the one or more of the first light-emitting elements.

5. The display device of claim 4, wherein
each of the one or more first light-emitting elements comprises an insulating film surrounding side surfaces of the first conductivity type semiconductor, the second conductivity type semiconductor, and the active layer, and
the insulating film contacts the first insulating layer.

6. The display device of claim 4, wherein light emitted from the active layer in at least one of the one or more first light-emitting elements travels parallel to the first direction.

7. The display device of claim 2, further comprising:
a second insulating layer disposed between the second electrode and the first insulating layer; and
an opening area disposed in an area surrounded by the second insulating layer to partially expose the first insulating layer.

8. The display device of claim 7, wherein
the first electrode overlaps the opening area and at least a part of the second insulating layer in the first direction, and
the one or more first light-emitting elements are disposed between the first electrode and the second electrode in the opening area.

9. The display device of claim 8, wherein an area of the first electrode is larger than that of the opening area.

10. The display device of claim 7, wherein
the second ends of the one or more first light-emitting elements partially protrude from an upper surface of the first insulating layer, and
the second electrode surrounds the second ends of the one or more first light-emitting elements partially protruding from the upper surface of the first insulating layers.

11. The display device of claim 10, wherein a thickness of the second insulating layer is greater than a height of the second ends of each of the one or more first light-emitting elements.

12. The display device of claim 11, wherein a length of each of the one or more first light-emitting elements extending in the direction is in a range of about 3 to about 6 μm.

13. The display device of claim 10, wherein the first electrode further comprises first electrode protrusions which protrude from an upper surface thereof to cover the first ends of the first light-emitting elements.

14. The display device of claim 7, further comprising:
a third electrode spaced apart from the first electrode in a second direction perpendicular to the first direction, the third electrode facing at least a part of the second electrode in the first direction; and
second light-emitting elements which are disposed between the third electrode and the second electrode,
wherein the first insulating layer is disposed between the third electrode and the second electrode.

15. The display device of claim 14, wherein
the second insulating layer partially overlaps the first electrode and the third electrode in the first direction, and
the first electrode and the third electrode are spaced apart from each other in an area overlapping the second insulating layer.

16. A method of manufacturing a display device, the method comprising:
preparing a base part including a first electrode, a first insulating layer covering the first electrode, and a second insulating layer partially disposed on the first insulating layer;
inserting light-emitting elements extending in a direction into the first insulating layer in a first direction perpendicular to an upper surface of the first insulating layer; and forming a second electrode covering the first insulating layer and the second insulating layer.

17. The method of claim 16, wherein the inserting of the light-emitting elements into the first insulating layer comprises:
spraying the light-emitting elements onto the first electrode;
aligning the light-emitting elements such that the direction in which the light-emitting elements extend is parallel to the first direction by forming an electric field adjacent to the first electrode; and
inserting the light-emitting elements into the first insulating layer in the first direction.

18. The method of claim 17, wherein
the second insulating layer comprises an opening area which partially exposes the first insulating layer, and
the light-emitting elements are inserted into the first insulating layer in the opening area.

19. The method of claim 18, wherein the forming of the second electrode further comprises removing the light-emitting elements sprayed on the second insulating layer.

20. The method of claim 19, wherein
an end of each of the light-emitting elements partially protrudes from the first insulating layer, and
the second electrode is formed to cover the end of each of the light-emitting elements.

* * * * *